United States Patent
Leung et al.

(10) Patent No.: US 9,130,666 B2
(45) Date of Patent: Sep. 8, 2015

(54) RECONFIGURABLE RECEIVER CIRCUITS FOR TEST SIGNAL GENERATION

(71) Applicant: QUALCOMM Incorporated, San Diego, CA (US)

(72) Inventors: Lai Kan Leung, San Marcos, CA (US); Chiewcharn Narathong, San Diego, CA (US); Jianyun Hu, San Diego, CA (US); Yunfei Feng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/303,552

(22) Filed: Jun. 12, 2014

(65) Prior Publication Data

US 2014/0295783 A1    Oct. 2, 2014

Related U.S. Application Data

(62) Division of application No. 13/787,214, filed on Mar. 6, 2013, now Pat. No. 8,774,745.

(60) Provisional application No. 61/735,453, filed on Dec. 10, 2012.

(51) Int. Cl.
*H04B 1/06*    (2006.01)
*H04B 17/00*    (2015.01)
*H04B 17/21*    (2015.01)
(Continued)

(52) U.S. Cl.
CPC ............... *H04B 17/008* (2013.01); *H04B 1/16* (2013.01); *H04B 17/00* (2013.01); *H04B 17/21* (2015.01); *H04B 17/29* (2015.01)

(58) Field of Classification Search
CPC ........ H03H 11/24; H03H 11/245; H03F 3/68; H03F 3/602
USPC ......................................... 455/249.1; 330/286
See application file for complete search history.

(56) References Cited

U.S. PATENT DOCUMENTS

| 3,711,782 A * | 1/1973 | Perrero et al. ................ 330/254 |
| 7,027,833 B1 | 4/2006 | Goodman |
| 7,035,617 B2 | 4/2006 | Buer et al. |

(Continued)

FOREIGN PATENT DOCUMENTS

WO    2009003101 A2    12/2008

OTHER PUBLICATIONS

Hashemi H., et al., "A 24-GHz SiGe phased-array receiver-LO phase-shifting approach," IEEE Transactions on Microwave Theory and Techniques, vol. 53 (2), Feb. 2005, pp. 614-626.

(Continued)

*Primary Examiner* — Lee Nguyen
(74) *Attorney, Agent, or Firm* — Ramin Mobarhan

(57) ABSTRACT

Receiver circuits that can be reconfigured to generate test signals in a wireless device are disclosed. In an exemplary design, an apparatus includes a mixer and an amplifier. The mixer downconverts an input radio frequency (RF) signal based on a local oscillator (LO) signal in a first mode. The amplifier, which is formed by at least a portion of the mixer, amplifies the LO signal and provides an amplified LO signal in a second mode. In another exemplary design, an apparatus includes an amplifier and an attenuator. The amplifier receives and amplifies an input RF signal in a first mode. The attenuator, which is formed by at least a portion of the amplifier, receives and passes an LO signal in a second mode.

16 Claims, 17 Drawing Sheets

Common-Source LNA & Interface Circuit

Programmable Attenuator

Reconfiguration

(51) Int. Cl.
 *H04B 17/29* (2015.01)
 *H04B 1/16* (2006.01)

(56) References Cited

U.S. PATENT DOCUMENTS

| | | |
|---|---|---|
| 7,084,808 B2 | 8/2006 | Ratzel et al. |
| 7,847,613 B1 | 12/2010 | Samavati |
| 7,911,269 B2 | 3/2011 | Yang et al. |
| 8,139,670 B1 | 3/2012 | Son et al. |
| 8,204,154 B2 | 6/2012 | Min et al. |
| 8,204,451 B1 | 6/2012 | Kheirkhahi et al. |
| 8,204,467 B2 | 6/2012 | Tillman et al. |
| 8,285,241 B2 | 10/2012 | Mirzaei et al. |
| 8,774,745 B2 | 7/2014 | Leung et al. |
| 2006/0009180 A1 | 1/2006 | Xu et al. |
| 2006/0068746 A1 | 3/2006 | Feng et al. |
| 2006/0121864 A1 | 6/2006 | Rodgers et al. |
| 2008/0013654 A1 | 1/2008 | Rick et al. |
| 2008/0057901 A1 | 3/2008 | Stoll et al. |
| 2009/0088124 A1 | 4/2009 | Schuur et al. |
| 2010/0227574 A1* | 9/2010 | Kuenen et al. ............ 455/115.2 |
| 2011/0001539 A1 | 1/2011 | Choksi et al. |
| 2012/0299633 A1 | 11/2012 | Kim et al. |
| 2013/0102316 A1 | 4/2013 | Ngai et al. |
| 2013/0222041 A1 | 8/2013 | Vavelidis |
| 2014/0171001 A1 | 6/2014 | Fernando et al. |

OTHER PUBLICATIONS

International Search Report and Written Opinion—PCT/US2013/075882—ISA/EPO—Mar. 27, 2014.
Stempox, "CPU Governors Explained" DroiDevs, Sep. 14, 2012, 6pgs.
International Search Report and Written Opinion—PCT/US2013/074221—ISAEPO—Jul. 7, 2014.
Rabieirad L., et al., "A dual-mode programmable distributed amplifier/mixer", Microwave Symposium Digest, 2009, MTT '09, IEEE MTT-S International, IEEE, Piscataway, NJ, USA, Jun. 7, 2009, pp. 581-584, XP031490585, ISBN: 978-1-4244-2803-8.

* cited by examiner

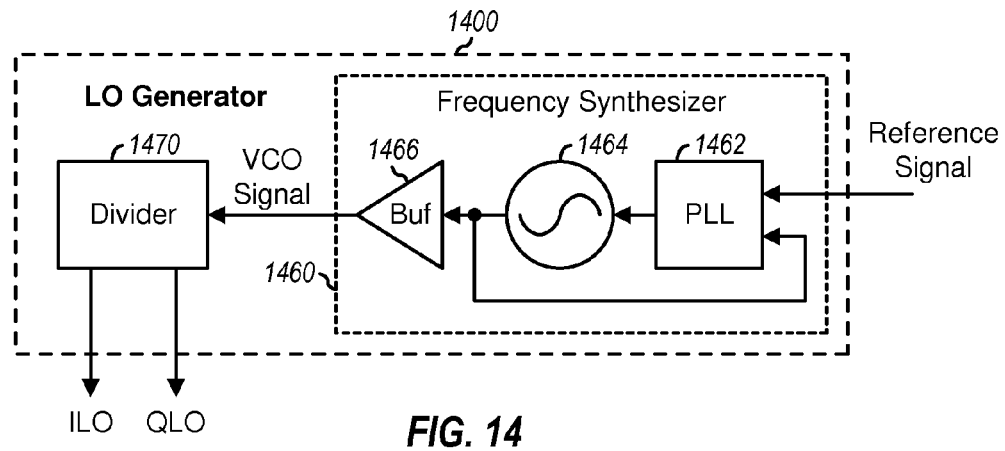
FIG. 14
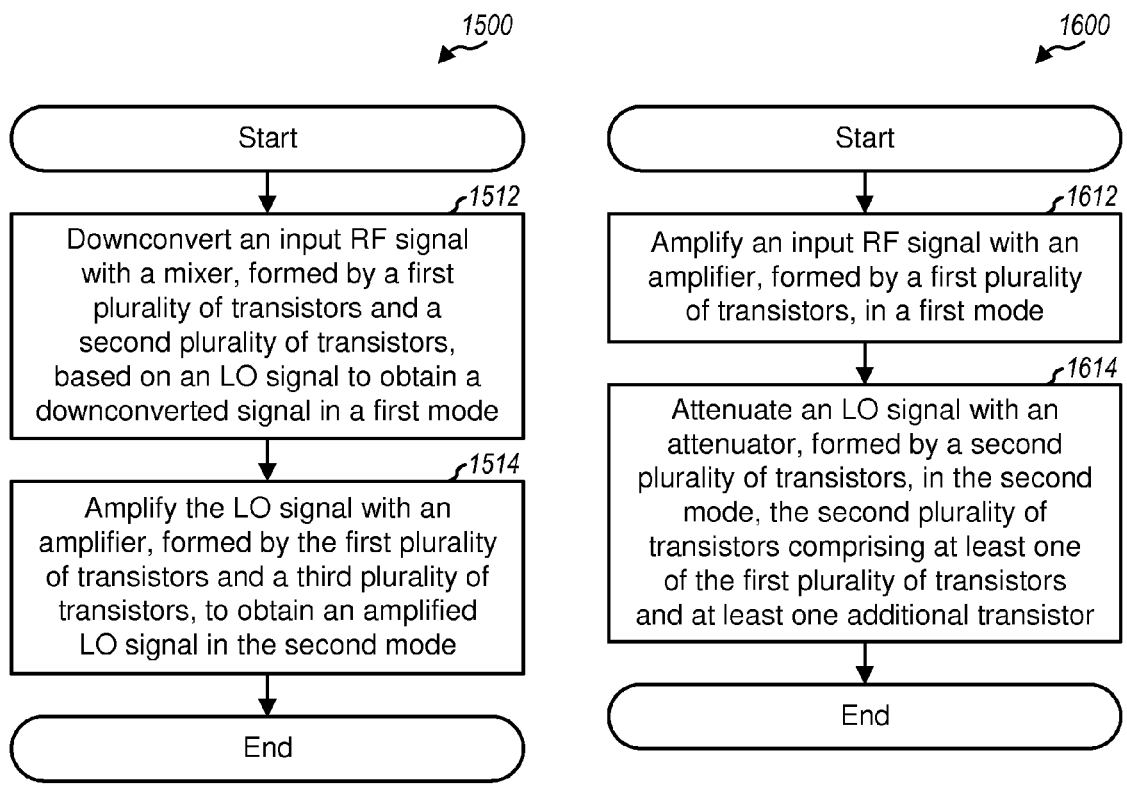
FIG. 15
FIG. 16

RECONFIGURABLE RECEIVER CIRCUITS FOR TEST SIGNAL GENERATION

CLAIM OF PRIORITY UNDER 35 U.S.C. §119

This application is a divisional application of U.S. patent application Ser. No. 13/787,214 entitled "RECONFIGURABLE RECEIVER CIRCUITS FOR TEST SIGNAL GENERATION" filed Mar. 6, 2013 and assigned to the assignee hereof and hereby expressly incorporated by reference herein.

BACKGROUND

I. Field

The present disclosure relates generally to electronics, and more specifically to receiver circuits for generating test signals.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a transmit local oscillator (LO) signal with data to obtain a modulated signal, amplify the modulated signal to obtain an output radio frequency (RF) signal having the proper output power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station. An LO signal is a periodic signal that may be used for frequency conversion.

A wireless device may include a number of receivers, and each receiver may include various circuits. The circuits in each receiver may be designed to meet specifications but may have performance that can vary widely due to variations in manufacturing, temperature, power supply voltage, etc. It may be desirable to test/calibrate these circuits in order to ensure good performance even in the presence of these variations.

BRIEF DESCRIPTION OF THE DRAWINGS

FIG. 14 shows an exemplary design of an LO generator.

FIG. 15 shows a process for performing downconversion and test signal generation.

FIG. 16 shows a process for performing amplification and test signal generation.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Receiver circuits that can be reconfigured to generate test signals in a wireless device are disclosed herein. The receiver circuits may be used for various electronic devices such as wireless communication devices (e.g., cellular phones, smartphones, etc.), tablets, personal digital assistants (PDAs), handheld devices, wireless modems, laptop computers, smartbooks, netbooks, cordless phones, wireless local loop (WLL) stations, Bluetooth devices, consumer electronic devices, etc. For clarity, use of the receiver circuits for a wireless communication device is described below.

Figure 1:
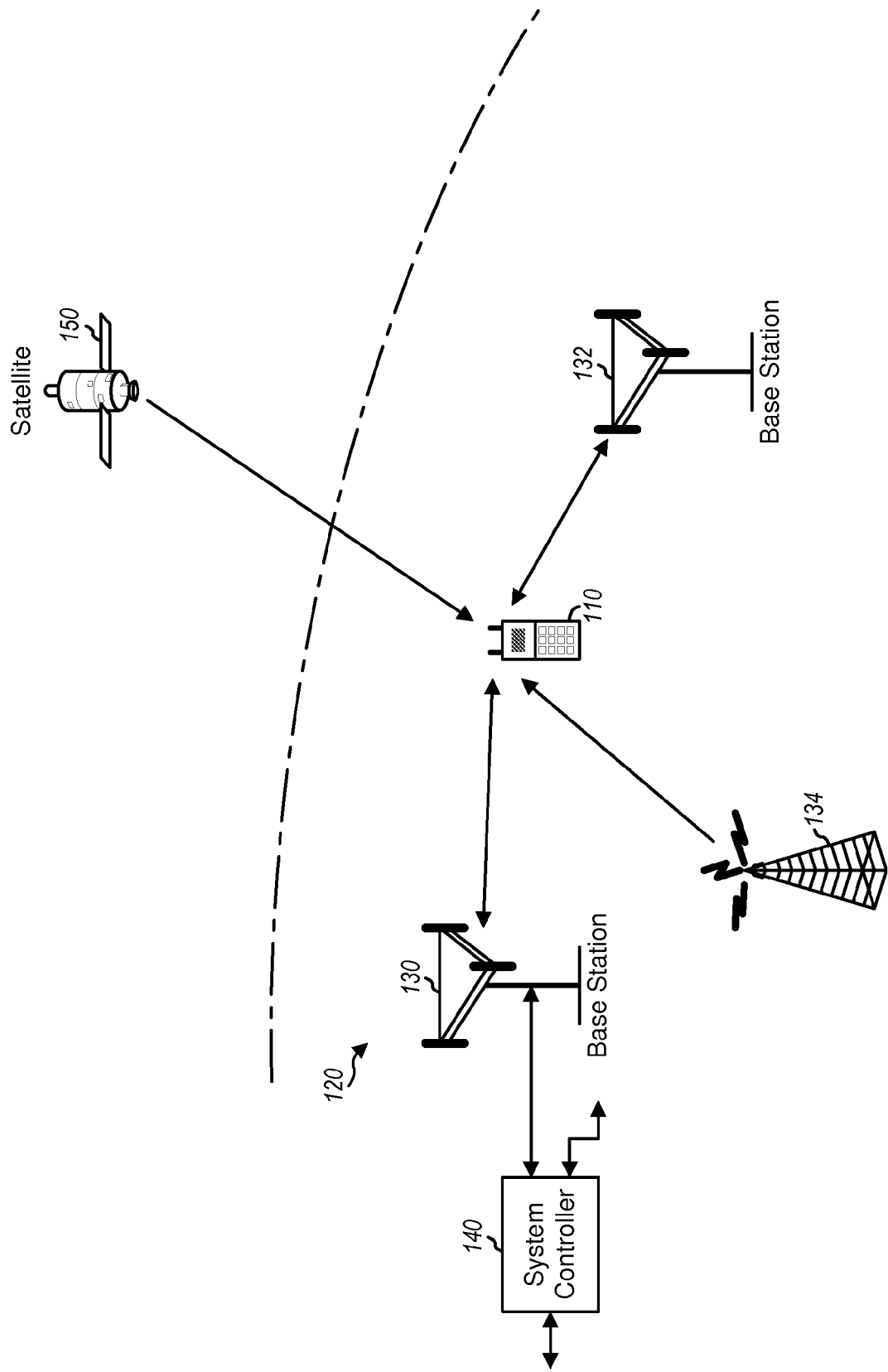
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in a publicly available document 3GPP TS 36.101. In general, any number of band groups may be defined. Each band group may cover any range of frequencies, which may or may not match any of the frequency ranges given above. Each band group may include any number of bands.

Wireless device 110 may support carrier aggregation, which is operation on multiple carriers. Carrier aggregation may also be referred to as multi-carrier operation. A carrier may refer to a range of frequencies used for communication and may be associated with certain characteristics. For example, a carrier may be associated with system information and/or control information describing operation on the carrier. A carrier may also be referred to as a component carrier (CC), a frequency channel, a cell, etc. A band may include one or more carriers. Each carrier may cover up to 20 MHz in LTE. Wireless device 110 may be configured with up to 5 carriers in one or two bands in LTE Release 11.

Wireless device 110 may receive multiple transmitted signals sent concurrently at different frequencies. These multiple transmitted signals may be sent by (i) one or more base stations on multiple carriers at different frequencies for carrier aggregation, or (ii) different base stations in the same wireless system for coordinated multi-point (CoMP), or (iii) one or more base stations in one or more wireless systems for concurrent services (e.g., concurrent voice/voice, voice/data, data/data, etc.), or (iv) one or more base stations for concurrent transmissions.

Figure 2:
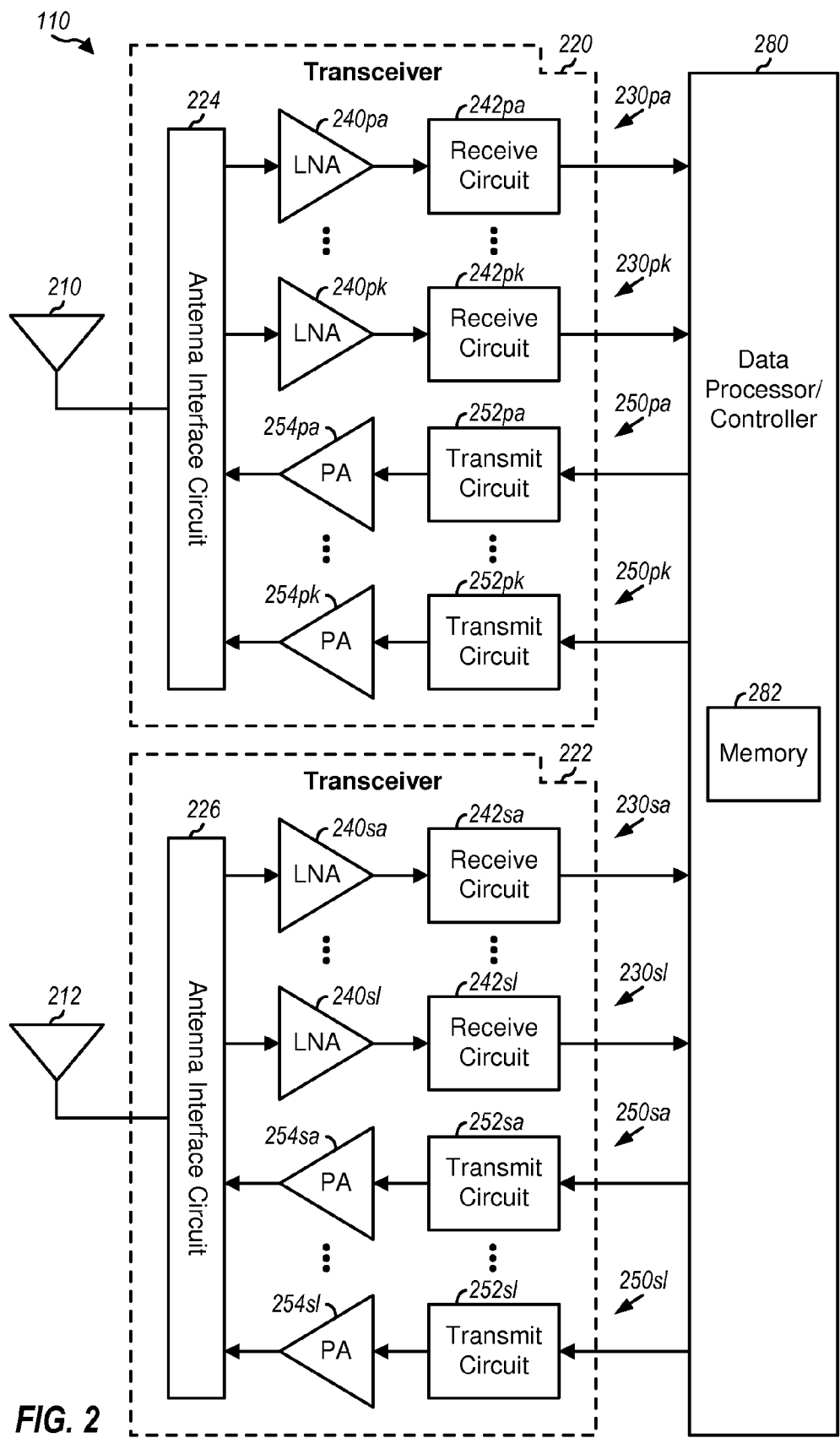
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230pa to 230pk and multiple (K) transmitters 250pa to 250pk to support multiple frequency bands, multiple radio technologies, carrier aggregation, etc. Transceiver 222 includes multiple (L) receivers 230sa to 230sl and multiple (L) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and a receive circuit 242. For data reception, antenna 210 receives signals from base stations and/or other transmitter stations and provides a received RF signal. An antenna interface circuit 224 receives the received RF signal and provides one or more input RF signals to one or more selected receivers. Antenna interface circuit 224 may include switches, duplexers, diplexers, transmit filters, receive filters, matching circuits, etc. The description below assumes that receiver 230pa is the only selected receiver. Within receiver 230pa, an LNA 240pa amplifies the input RF signal and provides an amplified RF signal. A receive circuit 242pa downconverts the amplified RF signal from RF to baseband, filters and amplifies the downconverted signal, and provides an input baseband signal to data processor 280. Receive circuit 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes a transmit circuit 252 and a power amplifier (PA) 254. For data transmission, data processor 280 processes (e.g., encodes and modulates) data to be transmitted and provides one or more output baseband signals to one or more selected transmitters. The description below assumes that transmitter 250pa is the only selected transmitter. Within transmitter 250pa, transmit circuit 252pa amplifies, filters, and upconverts the analog output signal from baseband to RF and provides a modulated RF signal. Transmit circuit 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250pa.

FIG. 2 shows an exemplary design of receivers 230 and transmitters 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on one or more RFICs. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of various circuits within transceivers 220 and 222. A memory 282 may store program codes and data for data processor/controller 280. Data processor/controller 280 may be implemented on one or more application specific integrated circuits (ASICs) and/or other ICs.

In general, a wireless device may include any number of receivers and any number of transmitters. The receivers and transmitters may be designed to meet specifications but may have performance that can vary widely due to variations in IC process, temperature, power supply voltage, etc. For example, the receivers and transmitters may be implemented with transistors having threshold voltages and device mismatches that may vary due to IC process variations. Variations of the threshold voltages and device mismatches may adversely impact performance of the wireless device. It may be desirable to test/calibrate circuits in receivers in order to ensure good performance even in the presence of variations in IC process, temperature, power supply voltage, etc.

In an aspect of the present disclosure, circuits in one receiver may be reconfigured and reused to generate a test signal for another receiver. This may enable circuits in receivers to be efficiently tested without requiring additional circuits or external equipments to generate the test signal. This may also provide other benefits described below.

Figure 3:
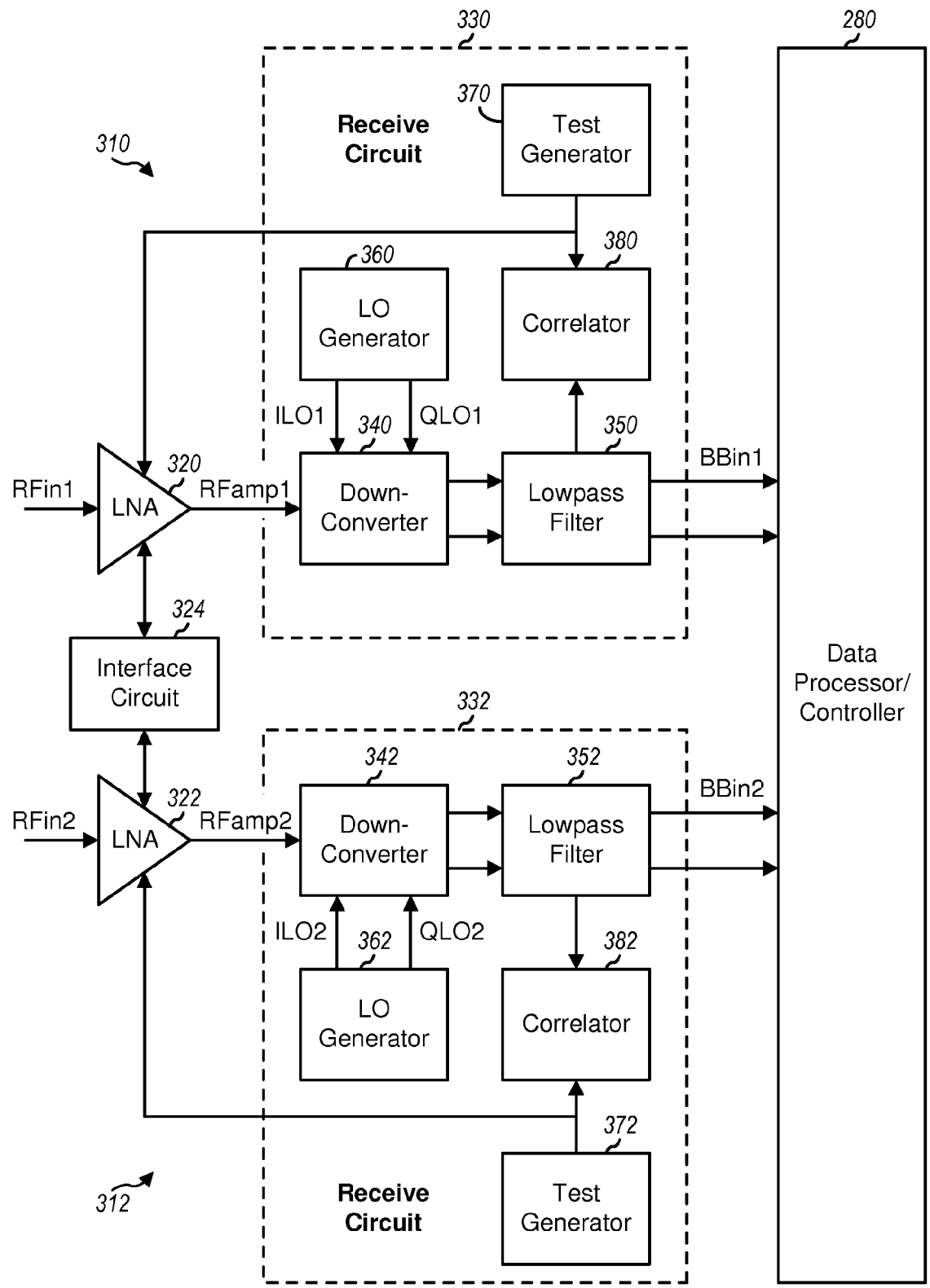
FIG. 3 shows a block diagram of two receivers with reconfigurable receiver circuits to generate test signals.

FIG. 3 shows a block diagram of an exemplary design of two receivers 310 and 312 with reconfigurable receiver circuits to generate test signals. Receiver 310 includes an LNA 320 and a receive circuit 330. Receiver 312 includes an LNA 322 and a receive circuit 332. Receivers 310 and 312 may correspond to any two receivers 230 in FIG. 2. LNAs 320 and 322 may correspond to any two LNAs 240 in FIG. 2. Receive circuits 330 and 332 may correspond to any two receive circuits 242 in FIG. 2.

Within receiver 310, LNA 320 has an input receiving a first input RF signal (RFin1), a first output coupled to receive circuit 330, and a second output coupled to an interface circuit 324. LNA 320 may amplify the RFin1 signal and provide a first amplified RF signal (RFamp1) to receive circuit 330.

Receive circuit 330 may receive the RFamp1 signal from LNA 320 and provide a first input baseband signal (BBin1) to data processor 280. Within receive circuit 330, a downconverter 340 may receive the RFamp1 signal from LNA 320 and a first inphase LO (ILO1) signal and a first quadrature LO (QLO1) signal from an LO generator 360. Downconverter 340 may downconvert the RFamp1 signal with the ILO1 and QLO1 signals and may provide first I and Q downconverted signals. The frequency of the ILO1 and QLO1 signals may be selected based on a carrier frequency and possibly a bandwidth of each transmitted signal being received by receive circuit 330. For example, if one transmitted signal is being received, then the frequency of the ILO1 and QLO1 signals may be equal to the center frequency of the transmitted signal being received. A lowpass filter 350 may filter the I and Q downconverted signals to remove undesirable signal components resulting from frequency downconversion, amplify the filtered I and Q signals, and provide first I and Q input baseband signals to data processor 280.

Within receiver 312, LNA 322 has an input receiving a second input RF signal (RFin2), a first output coupled to receive circuit 332, and a second output coupled to an interface circuit 324. LNA 322 may amplify the RFin2 signal and provide a second amplified RF signal (RFamp2) to receive circuit 332. Interface circuit 324 may be used to couple a test signal from one receiver to another receiver.

Receive circuit 332 may receive the RFamp2 signal from LNA 322 and provide a second input baseband signal (BBin2) to data processor 280. Within receive circuit 332, a downconverter 342 may receive the RFamp2 signal from LNA 320 and a second inphase LO (ILO2) signal and a second quadrature LO (QLO2) signal from an LO generator 362, downconvert the RFamp2 signal with the ILO2 and QLO2 signals, and provide I and Q downconverted signals. A lowpass filter 352 may filter the I and Q downconverted signals to remove undesirable signal components resulting from frequency downconversion, amplify the filtered I and Q signals, and provide second I and Q input baseband signals to data processor 280.

FIG. 3 shows an exemplary design of receive circuits 330 and 332. In general, the conditioning of the signals in a receive circuit may be performed by one or more amplifiers, filters, mixers, etc. These circuits may be arranged differently from the configuration shown in FIG. 3. For example, a filter and/or a gain control circuit may be located between an LNA and a downconverter. Furthermore, other circuits not shown in FIG. 3 may be used in a receive circuit. For example, matching circuits may be used to match various circuits in FIG. 3. Some circuits in FIG. 3 may be omitted. In one exemplary design, receivers 310 and 312 may be implemented on the same IC chip. In another exemplary design, receiver 310 may be implemented on a first IC chip, and receiver 312 may be implemented on a second IC chip.

Receivers 310 and 312 may support multiple operating modes, which may include a receive (RX) mode and a test/calibration mode. In the RX mode, one or more receivers may be selected to process one or more input RF signals to recover one or more transmitted signals of interest, e.g., as described above for FIG. 3. In the test/calibration mode, one or more receivers may be selected for testing/calibration, and another receiver may generate a test signal for the selected receiver(s).

Figure 4A:
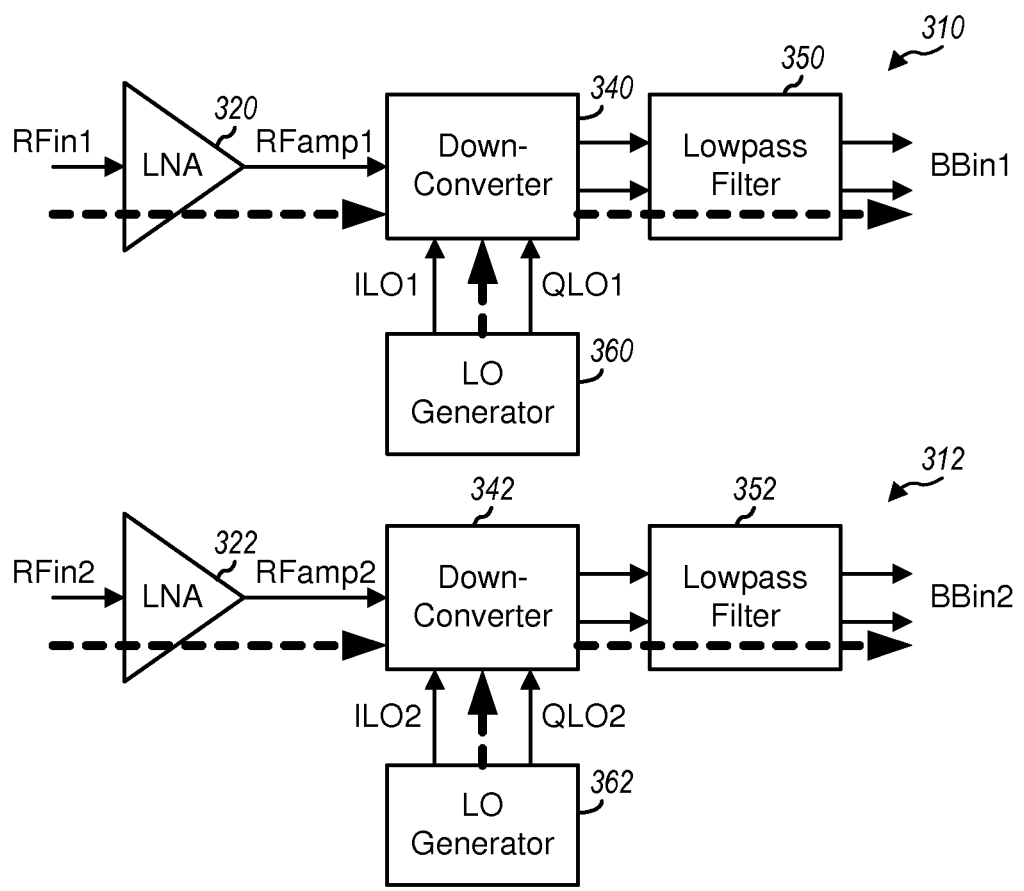
FIG. 4A shows operation of the two receivers in a receive (RX) mode.

FIG. 4A shows operation of receivers 310 and 312 in FIG. 3 in the RX mode. In general, only receiver 310, or only receiver 312, or both receivers 310 and 312 may be enabled in the RX mode. If receiver 310 is enabled, then LNA 320 may amplify the RFin1 signal and provide the RFamp1 signal to receive circuit 330. Within receive circuit 330, the RFamp1 signal may be downconverted by downconverter 340 with the ILO1 and QLO1 signals from LO generator 360 and filtered by lowpass filter 350 to obtain the BBin1 signal. If receiver 312 is enabled, then LNA 322 may amplify the RFin2 signal and provide the RFamp2 signal to receive circuit 332. Within receive circuit 332, the RFamp2 signal may be downconverted by downconverter 342 with the ILO2 and QLO2 signals from LO generator 362 and filtered by lowpass filter 352 to obtain the BBin2 signal.

Figure 4B:
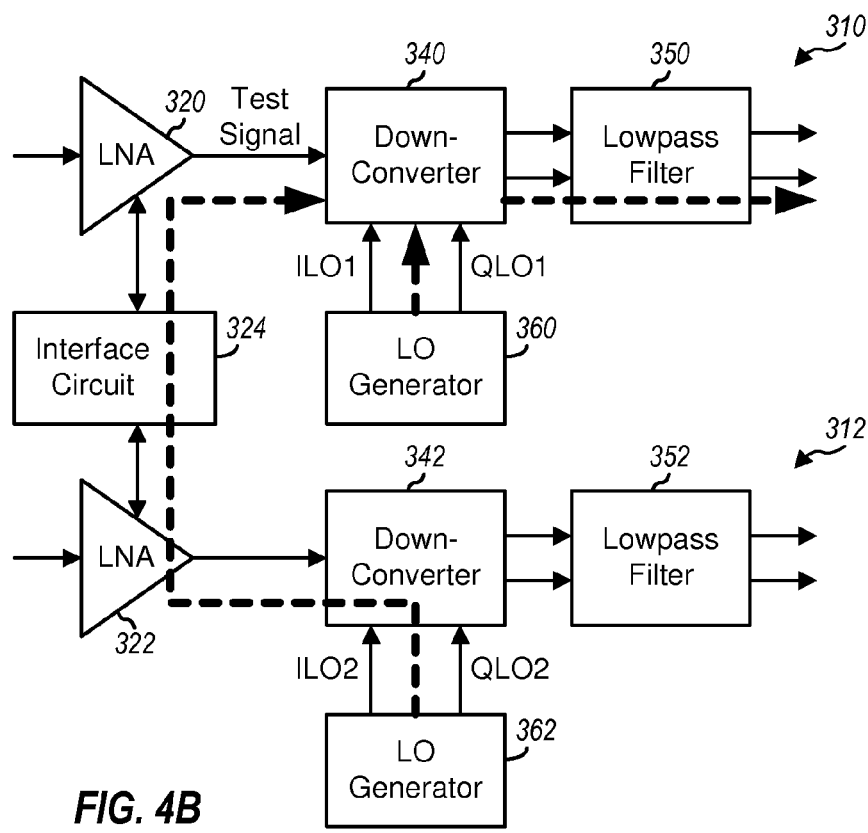
FIGS. 4B and 4C show operation of the two receivers in a test/calibration mode.

FIG. 4B shows operation of receivers 310 and 312 in FIG. 3 in the calibration mode with receiver 312 providing a test signal to receiver 310. In this case, LO generator 362 within receiver 312 may generate an LO signal, which may be passed through downconverter 342, LNA 322, and interface circuit 324 and provided as a test signal to receiver 310. LO generator 362 can generate the LO signal for the test signal over a full frequency range and with sufficient frequency accuracy to calibrate receiver 310.

Figure 4C:
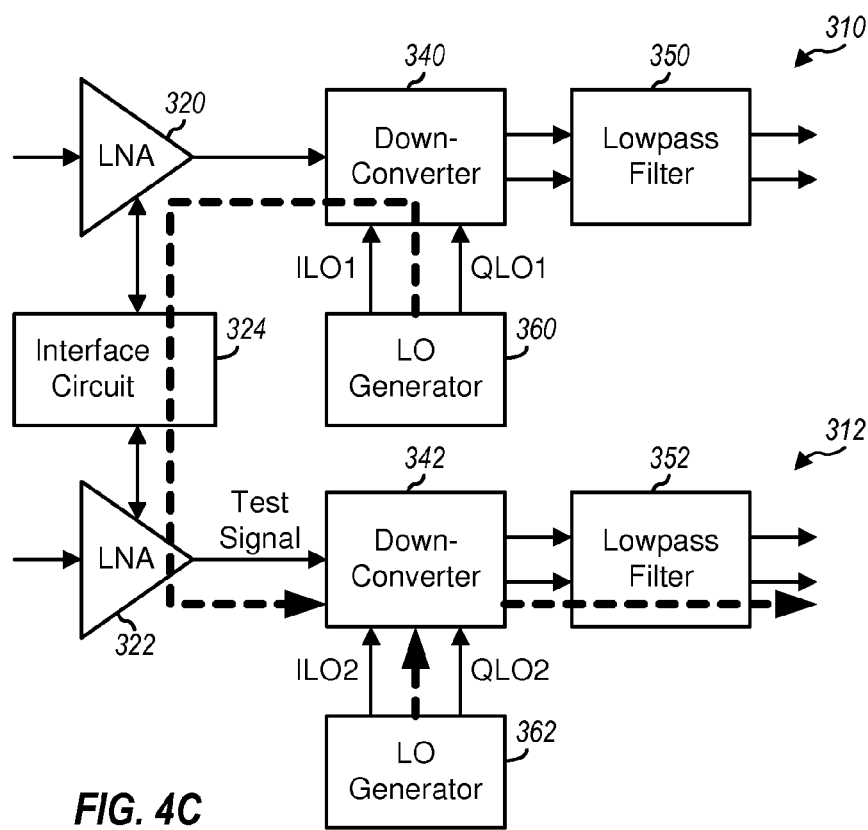

FIG. 4C shows operation of receivers 310 and 312 in FIG. 3 in the calibration mode with receiver 310 providing a test signal to receiver 312. In this case, LO generator 360 within receiver 310 may generate an LO signal, which may be passed through downconverter 340, LNA 320, and interface circuit 324 and provided as a test signal to receiver 312. LO generator 360 can generate the LO signal for the test signal over a full frequency range and with sufficient frequency accuracy to calibrate receiver 312.

Referring back to FIG. 3, test generators 370 and 372 may generate test control signals used to test receivers 310 and 312, respectively. Correlators 380 and 382 may perform correlation to test/calibrate receivers 310 and 312, respectively. Test generators 370 and 372 and correlators 380 and 382 are described in detail below.

Receivers 310 and 312 may be implemented in various manners. In one exemplary design, receivers 310 and 312 may be implemented on the same IC die, which may result in better integration of the receivers. In another exemplary design, receivers 310 and 312 may be implemented on separate IC dies, which may improve isolation between the two receivers. Receivers 310 and 312 may also be implemented in other manners.

The circuits in receivers 310 and 312 may be implemented with various circuit designs. An exemplary design of LNAs 320 and 322, downconverters 340 and 342, and lowpass filters 350 and 352 within receivers 310 and 312 is described below. The circuits in receivers 310 and 312 may also be implemented with transistors of various types. An exemplary design of LNAs 320 and 322 and downconverters 340 and 342 implemented with N-channel metal oxide semiconductor (NMOS) transistors is described below.

Figure 5:
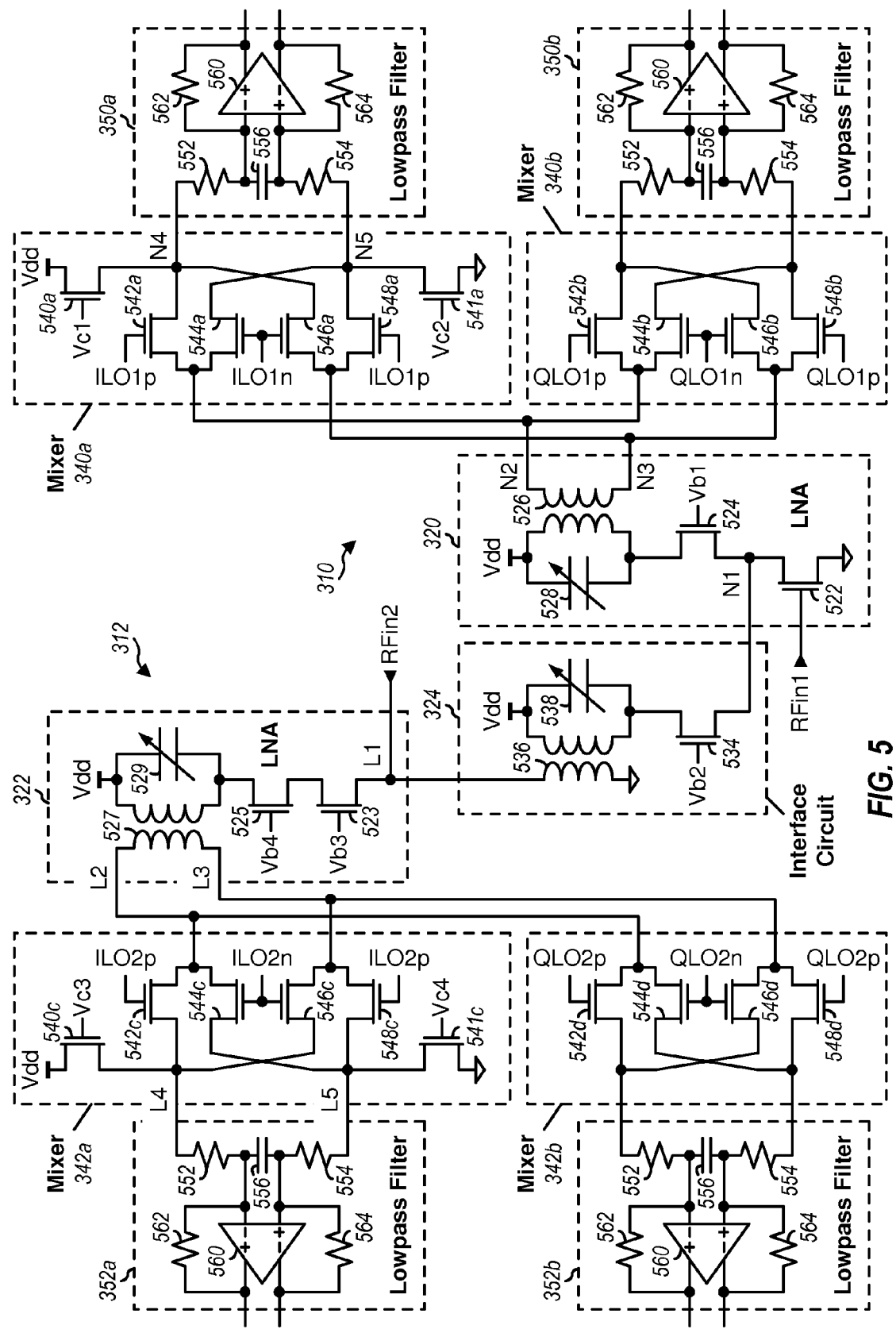
FIG. 5 shows an exemplary design of low noise amplifiers (LNAs), downconverters, lowpass filters, and an interface circuit in FIG. 3.

FIG. 5 shows a schematic diagram of an exemplary design of LNAs 320 and 322, downconverters 340 and 342, lowpass filters 350 and 352, and interface circuit 324 in FIG. 3. In the exemplary design shown in FIG. 5, within receiver 310, downconverter 340 includes two mixers 340a and 340b for the I and Q signal paths, and lowpass filter 350 includes two lowpass filters 350a and 350b for the I and Q signal paths. Within receiver 312, downconverter 342 includes two mixers 342a and 342b for the I and Q signal paths, and lowpass filter 352 includes two lowpass filters 352a and 352b for the I and Q signal paths.

In the exemplary design shown in FIG. 5, LNA 320 is implemented as a common-source LNA (CS LNA). Within LNA 320, a gain transistor 522 has its source coupled to circuit ground, its gate receiving the RFin1 signal, and its drain coupled to node N1. Alternatively, gain transistor 522 may have its source coupled to a source degeneration inductor, which may be further coupled to circuit ground (not shown in FIG. 5). A cascode transistor 524 has its source coupled to the drain of gain transistor 522 and its gate receiving a Vb1 bias voltage. A transformer 526 has (i) a primary coil coupled between the drain of cascode transistor 524 and a power supply voltage (Vdd) and (ii) a secondary coil coupled between nodes N2 and N3 and providing a differential amplified RF signal to mixers 340a and 340b of downconverter 340. A transformer may also be referred to as a balun. A variable capacitor 528 may be coupled between the drain of cascode transistor 524 and the Vdd supply. Transformer 526 and capacitor 528 form a tank circuit for LNA 320. Gain transistor 522 and cascode transistor 524 may be implemented with NMOS transistors (as shown in FIG. 5) or with transistors of other types.

In the exemplary design shown in FIG. 5, LNA 322 is implemented as a common-gate LNA (CG LNA), which may provide better isolation than a common-source LNA. Within LNA 322, a main transistor 523 has its source receiving the RFin2 signal and its gate receiving a Vb3 bias voltage. A cascode transistor 525 has its source coupled to the drain of main transistor 523 and its gate receiving a Vb4 bias voltage. A transformer 527 has (i) a primary coil coupled between the drain of cascode transistor 527 and the Vdd supply and (ii) a secondary coil coupled between nodes L2 and L3 and providing a differential amplified RF signal to mixers 342a and 342b of downconverter 342. A variable capacitor 529 may be coupled between the drain of cascode transistor 525 and the Vdd supply. Main transistor 523 and cascode transistor 525 may be implemented with NMOS transistors (as shown in FIG. 5) or with transistors of other types.

In the exemplary design shown in FIG. 5, interface circuit 324 is implemented with a cascode transistor 534 and a tank circuit comprising a transformer 536 and a variable capacitor 538. Cascode transistor 534 has its source coupled to the drain of gain transistor 522 within LNA 320 and its gate receiving a Vb2 bias voltage. Transformer 536 has (i) a primary coil coupled between the drain of cascode transistor 534 and the Vdd supply and (ii) a secondary coil coupled between node L1 and circuit ground. Node L1 also corresponds to the input of LNA 322. Variable capacitor 538 is coupled between the drain of cascode transistor 534 and the Vdd supply.

In the exemplary design shown in FIG. 5, mixers 340a, 340b, 342a and 342b are implemented with double-balanced passive mixers. Mixer 340a includes two pairs of NMOS transistors coupled as two differential pairs that are cross-coupled together. Transistors 542a and 544a have (i) their sources coupled together and to node N2 and (ii) their drains coupled to nodes N4 and N5, respectively. Similarly, transistors 546a and 548a have (i) their sources coupled together and to node N3 and (ii) their drains coupled to nodes N4 and N5, respectively. The ILO1 signal from LO generator 360 in FIG. 3 may be a differential signal comprising an ILO1p signal and an ILO1n signal. The ILO1p signal is provided to the gates of transistors 542a and 548a. The ILO1n signal is provided to the gates of transistors 544a and 546a. Nodes N2 and N3 correspond to a differential input of mixer 340a, and nodes N4 and N5 correspond to a differential output of mixer 340a.

In the exemplary design shown in FIG. 5, mixer 340a further includes transistors 540a and 541a, which are used to reconfigure mixer 530a as an amplifier. Transistor 540a has its source coupled to node N4, its gate receiving a Vc1 control signal, and its drain coupled to the Vdd supply. Transistor 541a has its source coupled to circuit ground, its gate receiving a Vc2 control signal, and its drain coupled to node N5. Transistors 540a and 541a may be NMOS transistors (as shown in FIG. 5) or transistors of other types.

In an exemplary design, mixer 340b within receiver 310 is implemented in similar manner as mixer 340a, except that NMOS transistors 540a and 541a in mixer 340a are omitted from mixer 340b, as shown in FIG. 5. In another exemplary design, mixer 340b may be implemented in the same manner as mixer 340a and may include two NMOS transistors coupled in similar manner as NMOS transistors 540a and 541a in mixer 340a. In this exemplary design, the two NMOS transistors in mixer 340b may be disabled by their gate bias voltages when mixer 340b is used as a mixer in a receiver. This exemplary design may result in better symmetry between mixers 340a and 340b, which may help to reduce IQ mismatches and may improve RSB. Mixer 340b includes NMOS transistors 542b, 544b, 546b and 548b, which are coupled in similar manner as transistors 542a, 544a, 546a and 548a within mixer 340a. The QLO1 signal from LO generator 360 may be a differential signal comprising a QLO1p signal and a QLO1n signal. The QLO1p signal is provided to the gates of transistors 542b and 548b. The QLO1n signal is provided to the gates of transistors 544b and 546b. Mixers 342a and 342b within receiver 312 are implemented in similar manner as mixers 340a and 340b, respectively, within receiver 310.

In the exemplary design shown in FIG. 5, lowpass filters 350a, 350b, 352a and 352b are implemented as active filters that perform filtering and amplification. Within filter 350a, a resistor 552 is coupled between node N4 and an inverting input of an amplifier 560. A resistor 554 is coupled between node N5 and a non-inverting input of amplifier 560. A capacitor 556 is coupled between the inverting and non-inverting inputs of amplifier 560. A resistor 562 is coupled between the inverting input and a non-inverting output of amplifier 560. A resistor 564 is coupled between the non-inverting input and an inverting output of amplifier 560. Although not shown in FIG. 5 for simplicity, capacitors may be coupled in parallel with resistors 552 and 554 and may be used for lowpass filtering. Capacitor 556 may have a smaller value and may be used to filter TX jammers, which are typically located outside the channel bandwidth. Amplifier 560 provides a differential I downconverted signal via its non-inverting and inverting outputs. Lowpass filters 350b, 352a and 352b are implemented in similar manner as lowpass filter 350a.

FIG. 5 shows exemplary designs of LNAs 320 and 322, downconverters 340 and 342, lowpass filters 350 and 352, and interface circuit 324. An LNA, a downconverter, a lowpass filter, and an interface circuit may also be implemented with other circuit designs. For example, an LNA may be implemented with an inverter-type LNA comprising an NMOS transistor and a PMOS transistor coupled in a stack and between the Vdd supply and circuit ground. Mixers 340a, 340b, 342a and 342b may be implemented with passive mixers as shown in FIG. 5 or with mixers of other types.

In one exemplary design, the same circuit design may be used for multiple receivers. For example, the same LNA and mixer design may be used for multiple receivers, e.g., for receivers for all bands in a wireless device supporting multiple bands, multiple modes, carrier aggregation, etc. In another exemplary design, different circuit designs may be used for different receivers. For example, different receivers may be associated with different LNA designs, different mixer designs, etc.

Figure 6:
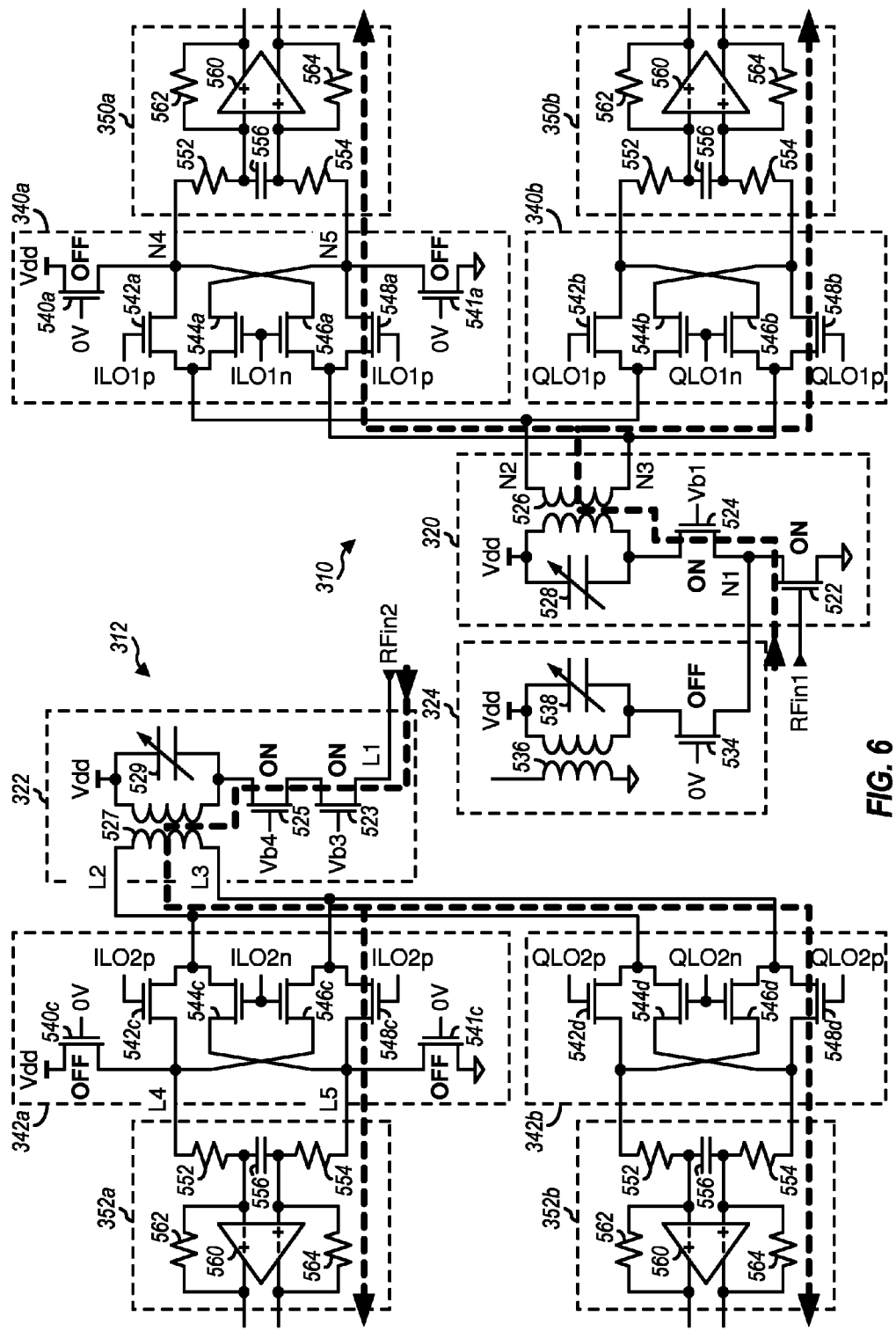
FIG. 6 shows operation of the two receivers in the RX mode.

FIG. 6 shows operation of receiver 310 in the RX mode. In the RX mode, LNA 320 is configured as an LNA, mixers 340a and 340b are configured as mixers, and interface circuit 324 is disabled. Within LNA 320, the Vb1 bias voltage is applied to the gate of cascode transistor 524. Gain transistor 522 receives and amplifies the RFin1 signal. Cascode transistor 524 buffers an output signal from gain transistor 522 and provides an amplified signal to the primary coil of transformer 526. The secondary coil of transformer 526 provides an amplified RF signal to mixers 340a and 340b.

Within mixer 340a, NMOS transistors 540a and 541a are turned OFF by applying a low voltage (e.g., 0 Volts (V)) at the gates of these transistors via the Vc1 and Vc2 control signals, respectively. Other voltages may be used to turn OFF transistors 540a and 541a if they are implemented with transistors of other types. For example, high voltages may be used to turn OFF transistors 540a and 541a if they are implemented with PMOS transistors. Transistors 542a to 548a operate as switching transistors that can be turned ON and OFF by the ILO1p and ILO1n signals to steer current from their sources to their drains. For each pair of transistors, only one transistor is turned ON at any given moment by the ILO1p or ILO1n signal and the other transistor is turned OFF by the ILO1n or ILO1p signal. The two transistors in each pair are alternately turned ON and OFF to steer the amplified RF signal from LNA 320 to nodes N4 and N5. In particular, transistors 542a and 544a are alternately turned ON and OFF by the ILO1p and ILO1n signals, respectively. Transistors 546a and 548a are also alternately turned ON and OFF by the ILO1n and ILO1p signals, respectively. Transistors 542a to 548a may be applied appropriate bias voltages at their gates (not shown in FIG. 6). The bias voltages may be selected to provide good performance for mixer 340a. Mixer 340a provides an I downconverted signal to lowpass filter 350a. Mixer 340b operates in similar manner as mixer 340a but is applied a differential QLO1 signal comprising the QLO1p and QLO1n signals. Mixer 340b downconverts the RFin1 signal with the QLO1 signal and provides a Q downconverted signal to lowpass filter 350b.

FIG. 6 also shows operation of receiver 312 in the RX mode. In the RX mode, LNA 322 is configured as an LNA, and mixers 342a and 342b are configured as mixers. Within LNA 322, the Vb3 and Vb4 bias voltages are applied to the gates of transistors 523 and 525, respectively. Transistor 523 receives and buffers the RFin2 signal. Transistor 525 buffers an output signal from transistor 523 and provides an amplified signal to the primary coil of transformer 527. The secondary coil of transformer 527 provides an amplified RF signal to mixers 342a and 342b.

Within mixer 342a, transistors 540c and 541c are turned OFF by applying a low voltage (e.g., 0V) at the gates of these transistors via the Vc1 and Vc2 control signals, respectively. Transistors 542c to 548c operate as switching transistors that can be turned ON and OFF by the ILO2p and ILO2n signals to steer current from their sources to their drains. For each pair of transistors, only one transistor is turned ON at any given moment by the ILO2p or ILO2n signal and the other transistor is turned OFF by the ILO2n or ILO2p signal. The two transistors in each pair are alternately turned ON and OFF to steer the amplified RF signal from LNA 322 to nodes L4 and L5. Transistors 542c to 548c may be applied appropriate bias voltages at their gates (not shown in FIG. 6). The bias voltages may be selected to provide good performance for mixer 342a. Mixer 342a provides an I downconverted signal to lowpass filter 352a. Mixer 342b operates in similar manner as mixer 342a but is applied a differential QLO2 signal comprising a QLO2p signal and a QLO2n signal. Mixer 342b downconverts the RFin2 signal with the QLO2 signal and provides a Q downconverted signal to lowpass filter 352b.

FIG. 6 shows configuration of LNAs 320 and 322 as LNAs and mixers 340a, 340b, 342a and 342b as mixers in the RX mode to receive and downconvert input RF signals and obtain downconverted signals. LNAs 320 and 322 and mixers 340a and 342a may be reconfigured and used to generate test signals for testing/calibration of circuits in receivers 310 and 312. Various tests may be supported and may include second order input intercept point (IIP2), residual sideband (RSB), etc. The test signals may also be used for calibration of gain (e.g., receiver gain), direct current (DC) offset correction, etc.

IIP2 is a measure of linearity that quantifies second-order distortion generated by nonlinearity of devices such as amplifiers and mixers. IIP2 may be measured by modulating an LO signal with a modulating signal to generate an amplitude-modulated (AM) test signal, downconverting the AM test signal to baseband, correlating the downconverted signal with the modulating signal, and determining IIP2 based on the correlation results. IIP2 may be improved by adjusting gate bias voltages of transistors having nonlinearity that affects IIP2.

RSB is a measure of gain imbalance and/or phase imbalance between I and Q signal paths. RSB may be measured by generating a single-tone test signal at a particular frequency, downconverting the single-tone test signal to obtain I and Q downconverted baseband signals, measuring the amplitude and phase of each of the I and Q downconverted baseband signals, and determining RSB based on amplitude error and phase error between the I and Q downconverted baseband signals. RSB may be improved by adjusting gate bias voltages of transistors, adjusting amplitude and/or phases of the ILO and QLO signals, digitally compensating I and Q samples obtained by digitizing the I and Q downconverted baseband signals, etc. Digital compensation may be applied after the ADC to account for amplitude and phase mismatches of the I and Q downconverted baseband signals.

Figure 7A:
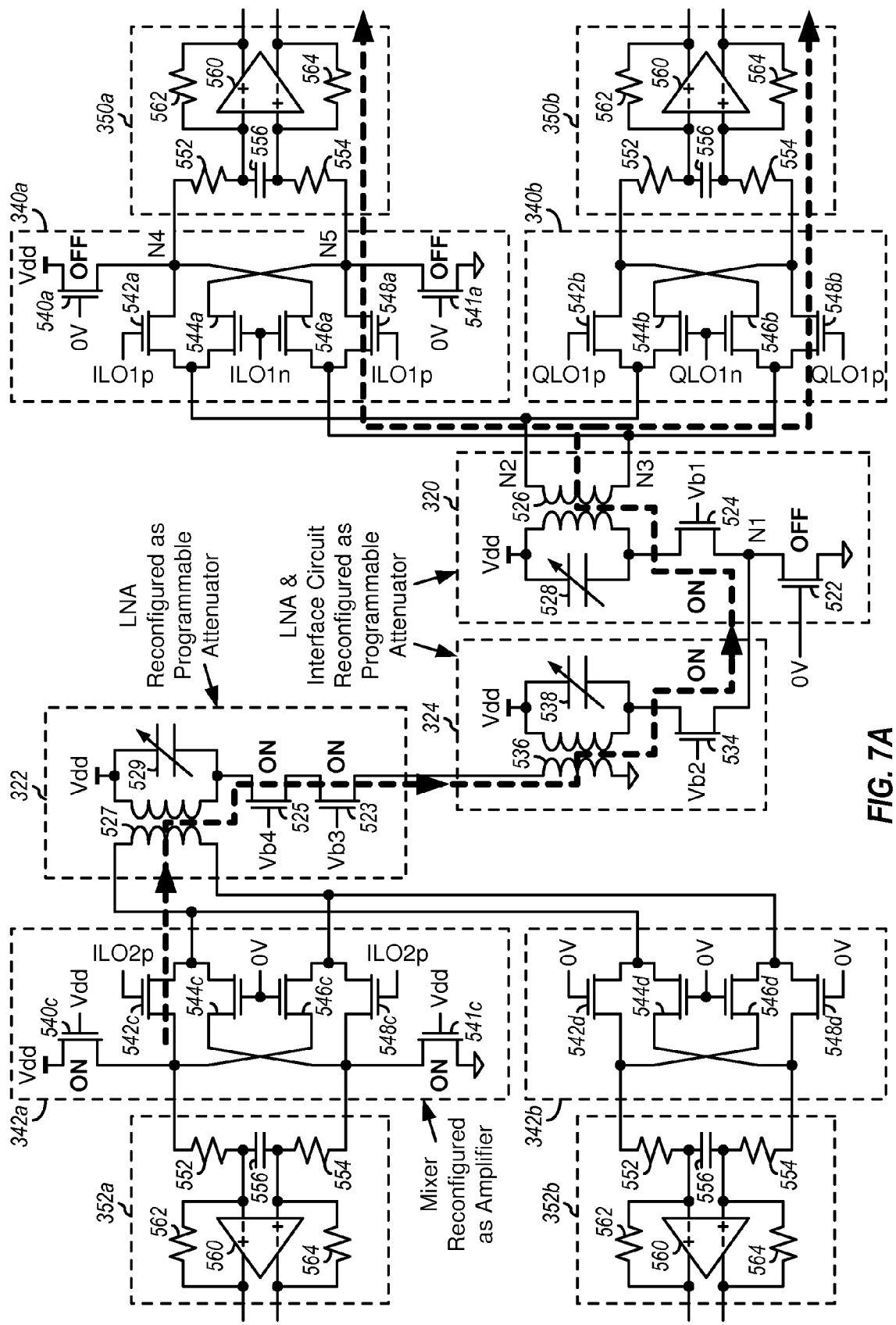
FIGS. 7A to 8B show operation of the two receivers in the test/calibration mode.

FIG. 7A shows operation of receivers 310 and 312 in the test/calibration mode for a first test configuration in which receiver 312 is reconfigured and used to generate a test signal for receiver 310. In this configuration, within receiver 312, mixer 342a is reconfigured as an amplifier, LNA 322 is reconfigured as a programmable attenuator, and mixer 342b and lowpass filters 352a and 352b are disabled. Within receiver 310, LNA 320 and interface circuit 324 are reconfigured as a programmable attenuator, and mixers 340a and 340b and lowpass filters 350a and 350b are enabled and operate in similar manner as in the RX mode.

Within receiver 312, mixer 342b may be disabled by applying a low voltage (e.g., 0V) at the gates of transistors 542d to 548d. Mixer 342a may be reconfigured as an amplifier by (i) turning OFF transistors 544c and 546c by applying a low voltage (e.g., 0V) at their gates, (ii) turning ON transistors 542c and 548c by applying appropriate bias voltages at their gates, and (iii) turning ON transistors 540c and 541c by applying a high voltage (e.g., Vdd) at their gates. LNA 322 may be reconfigured as a programmable attenuator by applying appropriate Vb3 and Vb4 bias voltages at the gates of transistors 523 and 525.

Within receiver 310, LNA 320 and interface circuit 324 may be reconfigured as a programmable attenuator by (i) turning ON transistor 534 by applying an appropriate bias voltage at its gate, (ii) turning ON cascode transistor 524 within LNA 320 by applying an appropriate bias voltage at its gate, and (iii) turning OFF gain transistor 522 within LNA 320 by applying a low voltage at its gate. Mixer 350a may operate as a mixer by turning OFF transistors 540a and 541a by applying a low voltage at their gates In the first test configuration, LO generator 362 for receiver 312 generates an LO signal at a desired test frequency (not shown in FIG. 7A). The LO signal is amplified by mixer 342a (which is reconfigured as an amplifier), passed through LNA 322 (which is reconfigured as a programmable attenuator), and provided as a test signal to receiver 310. Receiver 310 receives the test signal (instead of the RFin1 signal) and downconverts the test signal in similar manner as in the RX mode. Within receiver 310, the test signal is passed through interface circuit 324 and LNA 320 (which are reconfigured as a programmable attenuator) and downconverted by mixers 340a and 340b with ILO1 and QLO1 signals, respectively. The amplitude of the test signal may be adjusted by varying the bias voltages of transistors 524 and/or 534, varying the bias voltages of transistors 523 and/or 525, varying transistor size and/or drive strength of mixers, tuning an LC tank formed by transformer 526 and variable capacitor 528, tuning an LC tank formed by transformer 536 and variable capacitor 538, tuning an LC tank formed by transformer 527 and variable capacitor 529, etc. The I and Q downconverted signals from mixers 340a and 340b are filtered by lowpass filters 350a and 350b to obtain I and Q input baseband signals.

Figure 7B:
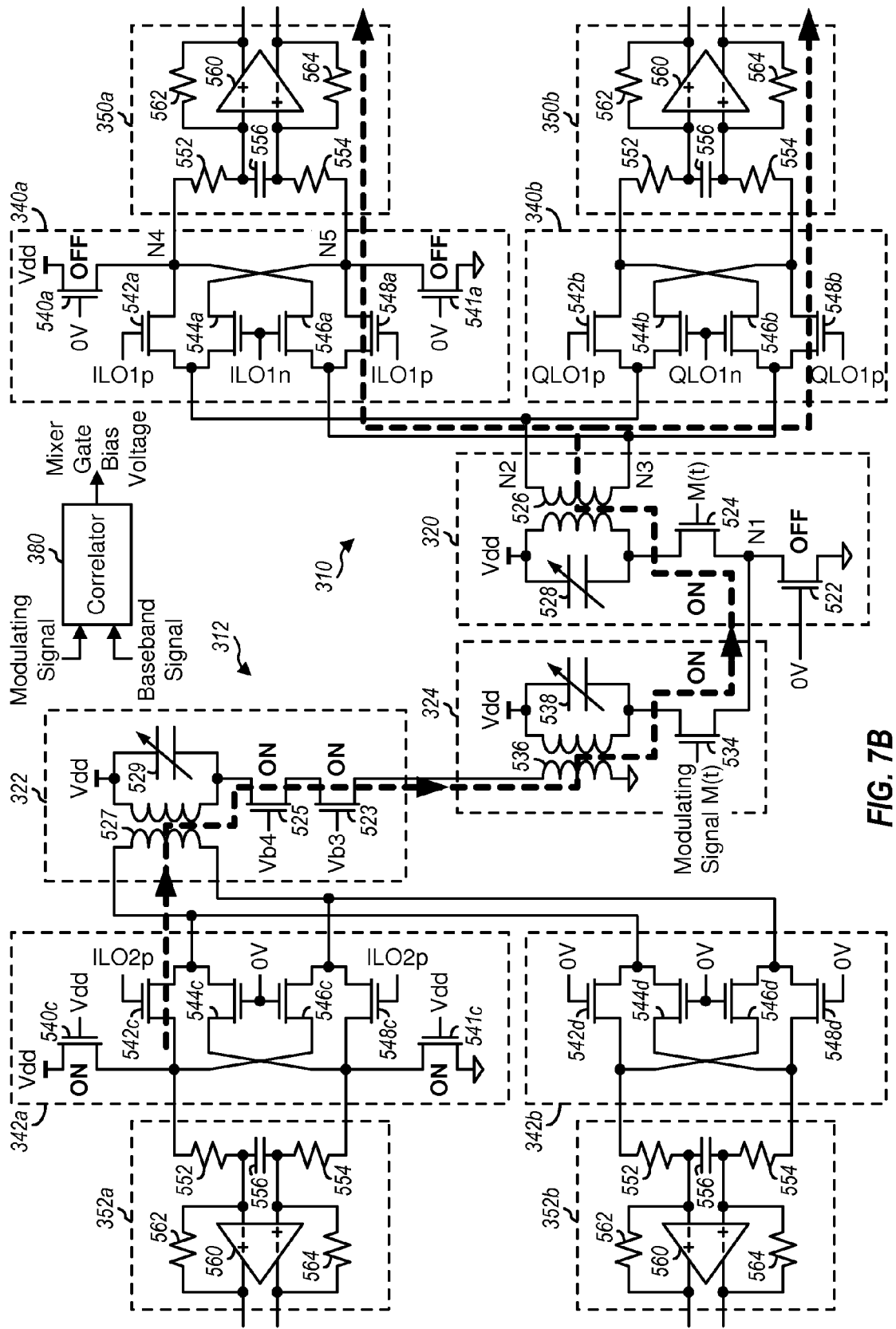

FIG. 7B shows operation of receivers 310 and 312 in the test/calibration mode for a second test configuration in which receiver 312 is used to generate an AM test signal for receiver 310. In this configuration, within receiver 312, mixer 342a is reconfigured as an amplifier, LNA 322 is reconfigured as a programmable attenuator, and mixer 342b and lowpass filters 352a and 352b are disabled. Within receiver 310, LNA 320 and interface circuit 324 are reconfigured as a programmable attenuator and an AM modulator, and mixers 340a and 340b and lowpass filters 350a and 350b are enabled.

The circuits within receivers 310 and 312 may be applied appropriate voltages and signals, as described above in FIG. 7A. However, instead of applying the Vb1 bias voltage at the gates of cascode transistor 524 within LNA 320 and the Vb2 bias voltage at the gate of cascode transistor 534 within interface circuit 324, a modulating signal m(t) may be generated by test generator 370 in FIG. 3 and may be applied to the gate of cascode transistor 524 and/or the gate of cascode transistor 534. The modulating signal may also be applied at other nodes within receiver 310 or receiver 312. For example, the modulating signal may be applied (i) at the gate of main transistor 523 and/or the gate of cascode transistor 525 within LNA 322, at the gate of transistor 540c and/or the gate of transistor 541c within mixer 342a, and/or (iii) at the gates of other transistors.

In the second test configuration, LO generator 362 for receiver 312 generates an LO signal at a desired test frequency (not shown in FIG. 7B). Within receiver 312, the LO signal is amplified by mixer 342a (which has been reconfigured as an amplifier), passed through LNA 322 (which has been reconfigured as a programmable attenuator and an AM modulator), and provided as a test signal to receiver 310. Within receiver 310, the test signal is provided to interface circuit 324 and LNA 320 (which have been reconfigured as a programmable attenuator) and modulated by the modulating signal to obtain an AM test signal. The AM test signal is downconverted by mixers 340a and 340b with the ILO1 and QLO1 signals, respectively, and filtered by lowpass filters 350a and 350b to obtain I and Q input baseband signals.

The modulating signal may be generated and applied in various manners to generate the AM test signal. AM modulation may be used for IIP2 calibration and/or other types of calibration. In one exemplary design, test generator 370 for receiver 310 generates the modulating signal and provides the modulating signal to an AM modulator and correlator 380 within the same receiver 310. The AM modulator may be implemented by LNA 320 and interface circuit 324. Correlator 380 correlates the modulating signal with the input baseband signals and provides correlation results to data processor 280. Correlator 380 may perform correlation in the analog domain (e.g., with circuits) or the digital domain (e.g., with digital signal processing). Data processor 280 may determine I and Q imbalance in the I and Q signal paths within receiver 310 and may generate control signals and/or bias voltages to reduce the I and Q imbalance. Alternatively or additionally, data processor 280 may determine the amount of nonlinear distortion generated by the circuits in receiver 310 and may generate bias voltages to improve linearity. Having separate test generators 370 and 372 and separate correlators 380 and 382 for receivers 310 and 312 may be beneficial if receivers 310 and 312 are implemented on separate IC chips. In this case, AM modulation and correlation may be performed locally for each receiver, which may avoid having to pass the modulating signal between IC chips.

In another exemplary design, test generator 372 for receiver 312 generates a modulating signal and provides the modulating signal to an AM modulator and a correlator within the other receiver 310. In yet another exemplary design, a single test generator may generate modulating signals for both receivers 310 and 312. This exemplary design may provide good performance, e.g., when receivers 310 and 312 are implemented on the same IC chip.

Figure 8A:
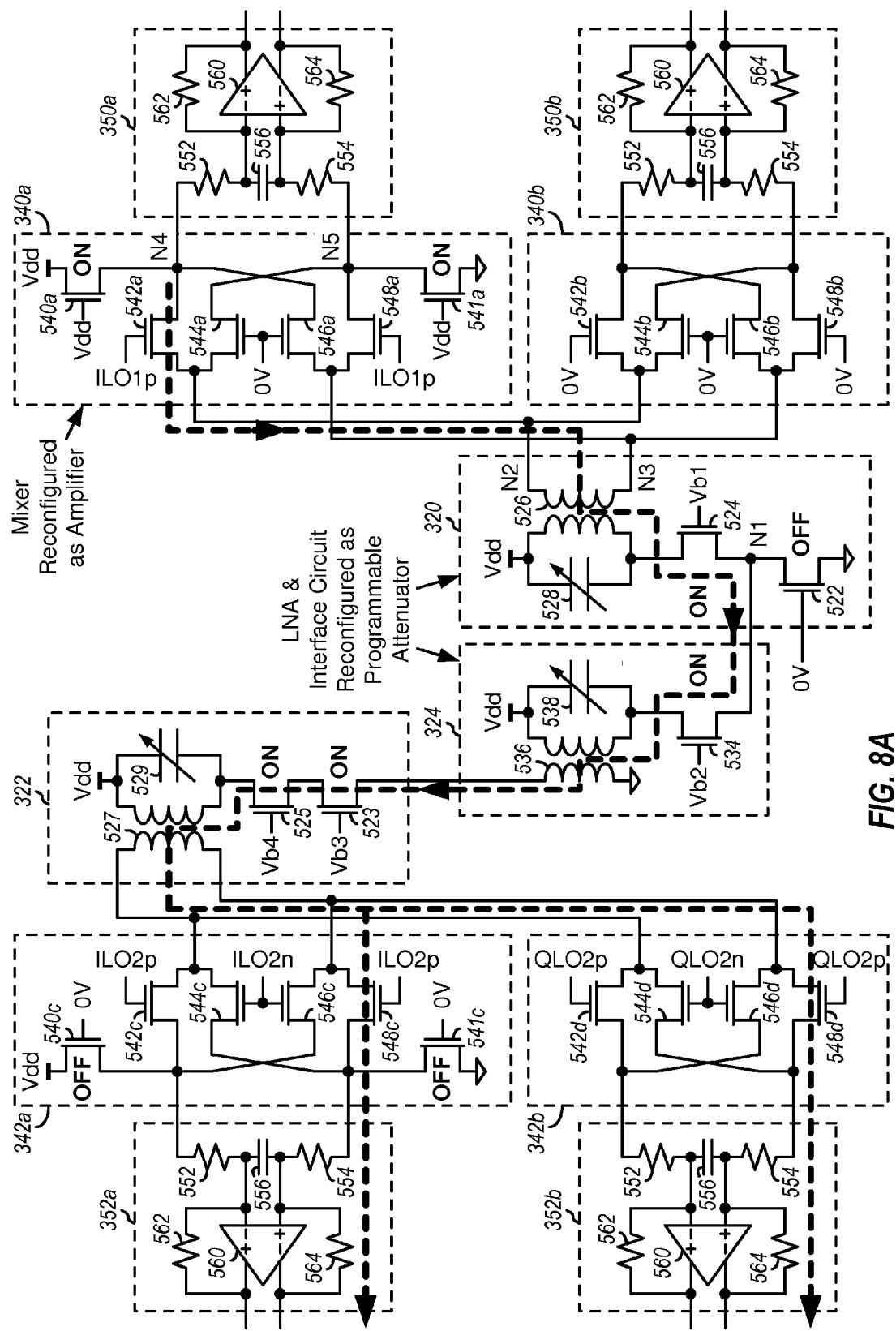

FIG. 8A shows operation of receivers 310 and 312 in the test/calibration mode for a third test configuration in which receiver 310 is reconfigured and used to generate a test signal for receiver 312. In this configuration, within receiver 310, mixer 340a is reconfigured as an amplifier, LNA 320 and interface circuit 324 are reconfigured as a programmable attenuator, and mixer 340b and lowpass filters 350a and 350b are disabled. Within receiver 312, LNA 322 is configured as an LNA, and mixers 342a and 342b and lowpass filters 352a and 352b are enabled.

Within receiver 310, mixer 340b may be disabled by applying a low voltage (e.g., 0V) at the gates of transistors 542b to 548b. Mixer 340a may be reconfigured as an amplifier by (i) turning OFF transistors 544a and 546a by applying a low voltage (e.g., 0V) at their gates, (ii) turning ON transistors 542a and 548a by applying appropriate bias voltages at their gates, and (iii) turning ON transistors 540a and 541a by applying a high voltage (e.g., Vdd) at their gates. LNA 320 and interface circuit 324 may be reconfigured as a programmable attenuator by (i) turning ON cascode transistor 524 within LNA 320 by applying an appropriate Vb1 bias voltage at its gate, (ii) turning ON cascode transistor 534 within interface circuit 324 by applying an appropriate Vb2 bias voltage at its gate, and (iii) turning OFF gain transistor 522 with LNA 320 by applying a low voltage (e.g., 0V) at its gate.

Within receiver 312, LNA 322 may be configured as an LNA by applying appropriate Vb3 and Vb4 bias voltages at the gates of transistors 523 and 525, respectively. Mixer 352a may be configured as a mixer by turning OFF transistors 540c and 541c by applying a low voltage (e.g., 0V) at their gates.

In the third test configuration, LO generator 360 for receiver 310 generates an LO signal at a desired test frequency (not shown in FIG. 8A). Within receiver 310, the LO signal is amplified by mixer 340a (which is reconfigured as an amplifier), passed through LNA 320 and interface circuit 324 (which are reconfigured as a programmable attenuator), and provided as a test signal to receiver 312. Receiver 312 receives the test signal (instead of the RFin2 signal) and downconverts the test signal in similar manner as in the RX mode. Within receiver 312, the test signal is passed through LNA 322 and downconverted by mixers 342a and 342b with the ILO2 and QLO2 signals, respectively. The amplitude of the test signal may be adjusted by varying the bias voltages of transistors, varying the transistor size and/or drive strength of mixers, tuning LC tanks, etc. The I and Q downconverted signals from mixers 342a and 342b are filtered by lowpass filters 352a and 352b to obtain I and Q input baseband signals.

Figure 8B:
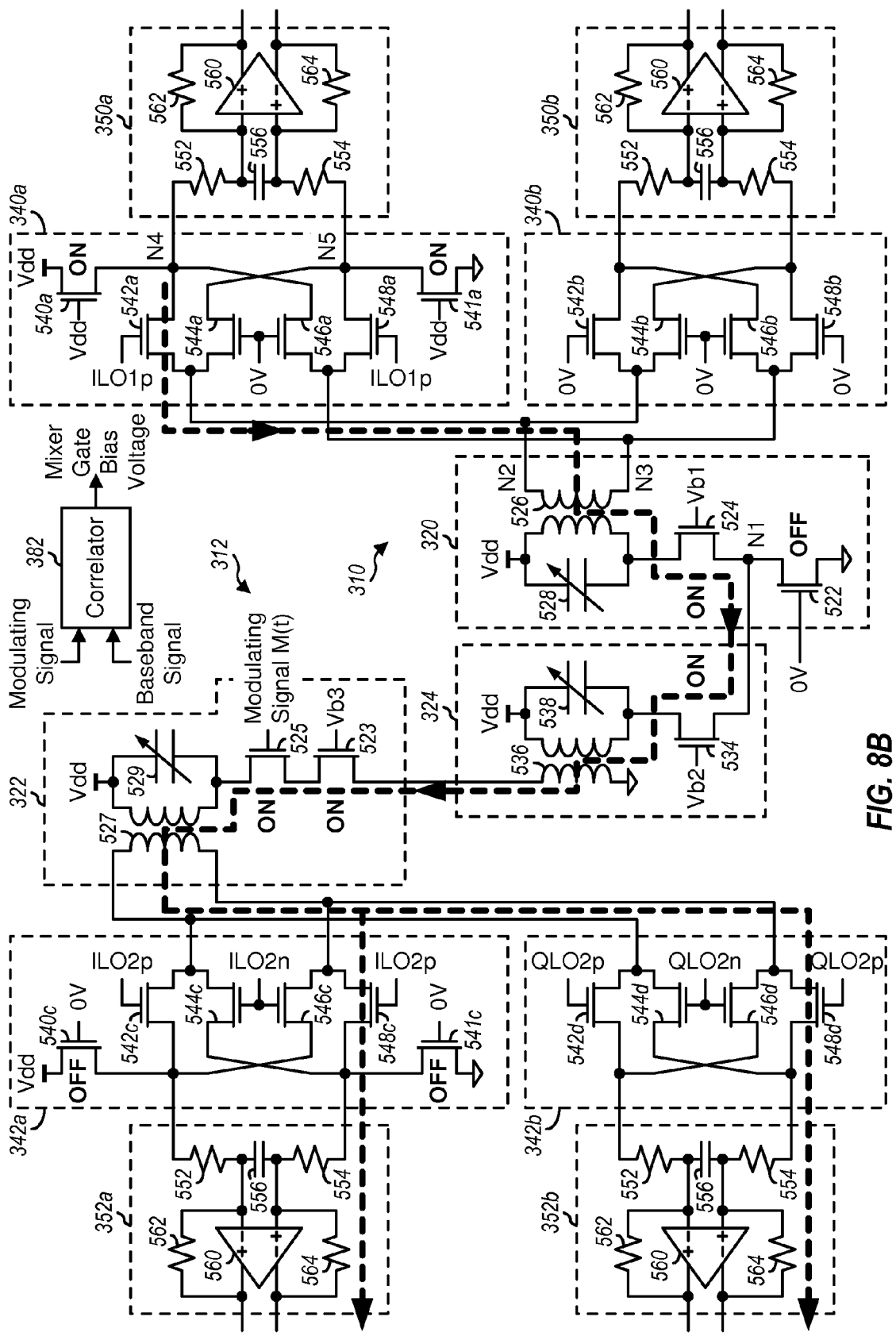

FIG. 8B shows operation of receivers 310 and 312 in the test/calibration mode for a fourth test configuration in which receiver 310 is used to generate an AM test signal for receiver 312. In this configuration, within receiver 310, mixer 340a is reconfigured as an amplifier, LNA 320 and interface circuit 324 are reconfigured as a programmable attenuator, and mixer 340b and lowpass filters 350a and 350b are disabled. Within receiver 312, LNA 322 is reconfigured as a programmable attenuator and AM modulator, and mixers 342a and 342b and lowpass filters 352a and 352b are enabled.

The circuits within receivers 310 and 312 may be applied appropriate voltages and signals, as described above in FIG. 8A. However, instead of applying the Vb4 bias voltage at the gate of cascode transistor 525 within LNA 322, a modulating signal may be generated by test generator 372 in FIG. 3 and may be applied to the gate of transistor 525. The modulating signal may also be applied at other nodes within receiver 310 or receiver 312. For example, the modulating signal may be applied at the gate of main transistor 523 within LNA 322, at the gate of cascode transistor 524 within LNA 320, at the gate of cascode transistor 534 within interface circuit 324, etc.

In the fourth test configuration, LO generator 360 for receiver 310 generates an LO signal at a desired test frequency (not shown in FIG. 8B). The LO signal is amplified by mixer 340a (which is reconfigured as an amplifier), passed through LNA 320 and interface circuit 524 (which are reconfigured as a programmable attenuator), and provided as a test signal to receiver 312. Within receiver 312, the test signal is provided to LNA 322 (which is reconfigured as an AM modulator) and modulated by the modulating signal to obtain an AM test signal. The AM test signal is downconverted by mixers 342a and 342b with ILO2 and QLO2 signals, respectively, and filtered by lowpass filters 352a and 352b to obtain I and Q input baseband signals.

In the exemplary designs shown in FIGS. 7A to 8B, an adjustable amount of attenuation (and hence a variable amplitude test signal) may be obtained by varying one or more bias voltages of one or more transistors, or varying bias current of one or more transistors, or adjusting one or more variable capacitors of one or more tank circuits, or a combination thereof. In an exemplary design, an adjustable amount of attenuation may be obtained by varying one or more of the Vb1, Vb2, Vb3 and Vb4 bias voltages for transistors 524, 534, 523 and 525, respectively, in FIG. 7A. In another exemplary design, an adjustable amount of attenuation may be obtained by varying the bias current and/or transistor size of transistors 542 to 548 in mixer 340a or 342a. In yet another exemplary design, an adjustable amount of attenuation may be obtained by adjusting variable capacitor 528, 529 and/or 538. An adjustable amount of attenuation may also be obtained in other manners based on other control mechanisms. An adjustable amount of attenuation may be obtained based on any one or any combination of the exemplary designs described above and/or based on other control mechanisms.

FIGS. 7A to 8B show some exemplary test configurations that may be supported by receivers 310 and 312 in FIGS. 3 and 5. Other test configurations may also be supported.

Figure 9:
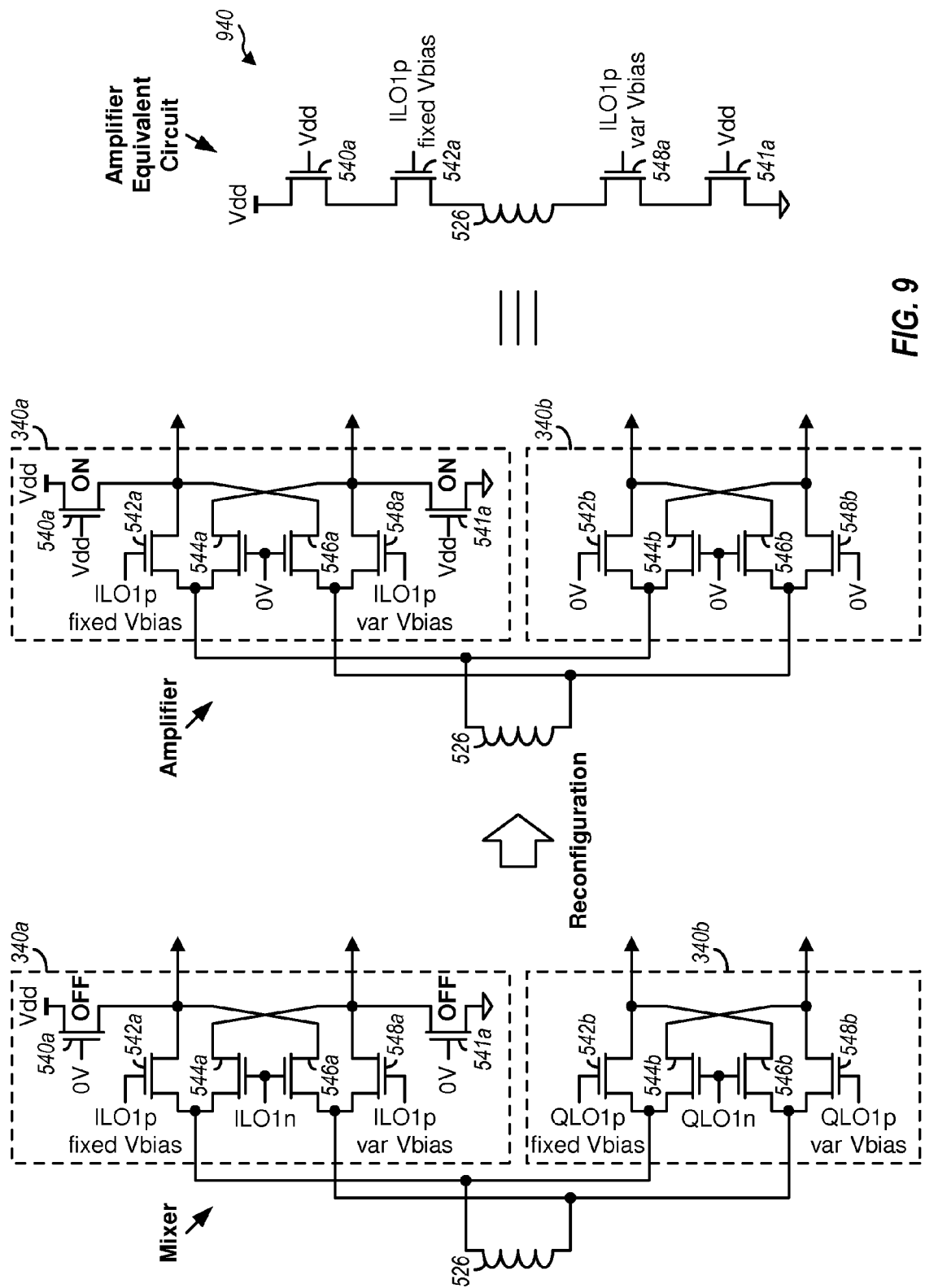
FIG. 9 shows reconfiguration of a mixer as an amplifier.

FIG. 9 shows an exemplary design of reconfiguring mixer 340a in FIG. 5 as an amplifier. As shown on the left side of FIG. 9, mixer 340a may be configured as a mixer by turning OFF transistors 540a and 541a, applying the ILO1p signal to the gates of transistors 542a and 548a, and applying the ILO1n signal to the gates of transistors 544a and 546a. As shown in the middle of FIG. 9, mixer 340a may be reconfigured as an amplifier by turning ON transistors 540a and 541a, turning OFF transistors 544a and 546a, and applying the ILO1p signal to the gates of transistors 542a and 548a. The ILO1n, QLO1p or QLO1n signal may also be applied to transistors 542a and 548a.

The right side of FIG. 9 shows an equivalent circuit of mixer 340a reconfigured as an amplifier 940. Transistor 540a acts as a switch that couples the Vdd supply to the drain of transistor 542a. Transistor 541a also acts as a switch that couples the source of transistor 548a to circuit ground. In an exemplary design, the gate of transistor 542a may be applied a fixed bias voltage, and the gate of transistor 548a may be applied a variable bias voltage. In general, the gate of each transistor may be applied a fixed or a variable bias voltage. The gates of transistors 542a and 548a may also be applied the ILO1p signal. A differential output signal may be provided to the secondary coil of transformer 526 by the source of transistor 542a and the drain of transistor 548a.

As shown in FIG. 9, a passive mixer may be reconfigured as an amplifier with the same ILO1p signal being applied to both transistor 542a above the secondary coil of transformer 526 and transistor 548a below the secondary coil. The amplifier may provide a gain greater than one or less than one. No extra transistors are added in the LO signal path, which may reduce performance degradation. DC bias of the amplifier may be adjusted by varying the bias voltage applied to transistor 542a and/or the bias voltage applied to transistor 548a.

Figure 10:
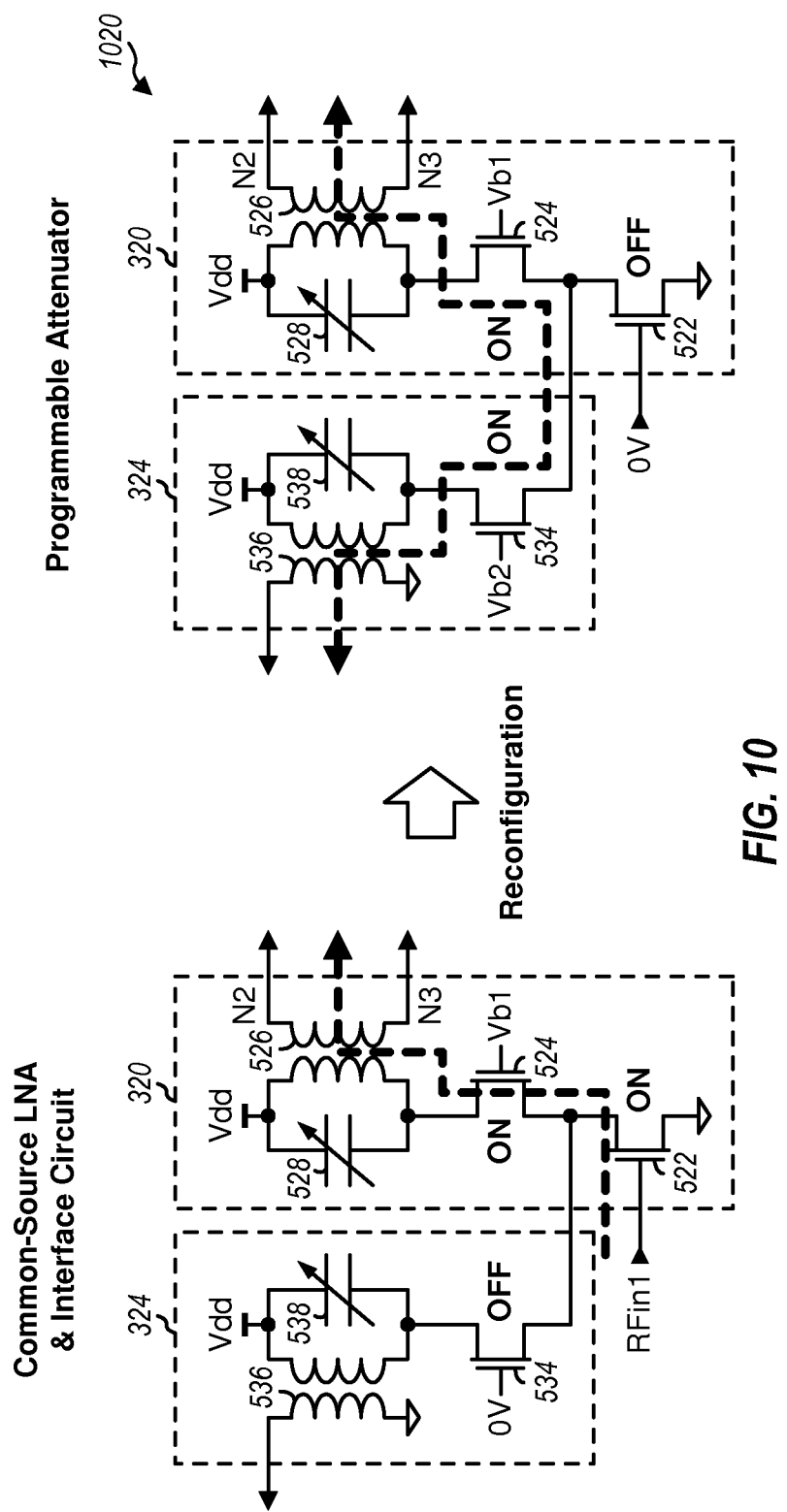
FIG. 10 shows reconfiguration of a common-source LNA and an interface circuit as a programmable attenuator.

FIG. 10 shows an exemplary design of reconfiguring LNA 320 and interface circuit 324 in FIG. 5 as a programmable attenuator. As shown on the left side of FIG. 10, LNA 320 may be configured as an LNA by turning OFF cascode transistor 534 within interface circuit 324, applying the RFin1 signal to the gate of gain transistor 522, and applying the Vb1 bias voltage to the gate of cascode transistor 524. The RFin1 signal may be amplified by gain transistor 522 and buffered by cascode transistor 524 to obtain an amplified RF signal, which may be provided to transformer 526.

As shown on the right side of FIG. 10, LNA 320 and interface circuit 324 may be reconfigured as a bi-directional programmable attenuator 1020 by turning OFF gain transistor 522 within LNA 320 and applying appropriate bias voltages to the gates of cascode transistors 524 and 534. In this case, cascode transistors 524 and 534 operate as switches having ON resistance that is dependent on their gate voltages. From DC perspective, the sources of transistors 524 and 534 are coupled together, and the drains of transistors 524 and 534 are coupled to the Vdd supply. Hence, the bias voltages applied to the gates of transistors 524 and 534 should be higher than Vdd in order to ensure that transistors 524 and 534 are turned ON. In an exemplary design, the Vb1 and/or Vb2 bias voltage may be adjustable/programmable in order to obtain variable attenuation through transistors 524 and 534. In an exemplary design, Vdd may be 1.2 volts (V), and the Vb1 and Vb2 bias voltages may be within a range of 1.5V to 1.8V and may be adjustable in steps of 50 millivolts (mV). Other Vdd voltages, voltage ranges, and/or step sizes may also be used.

Figure 11:
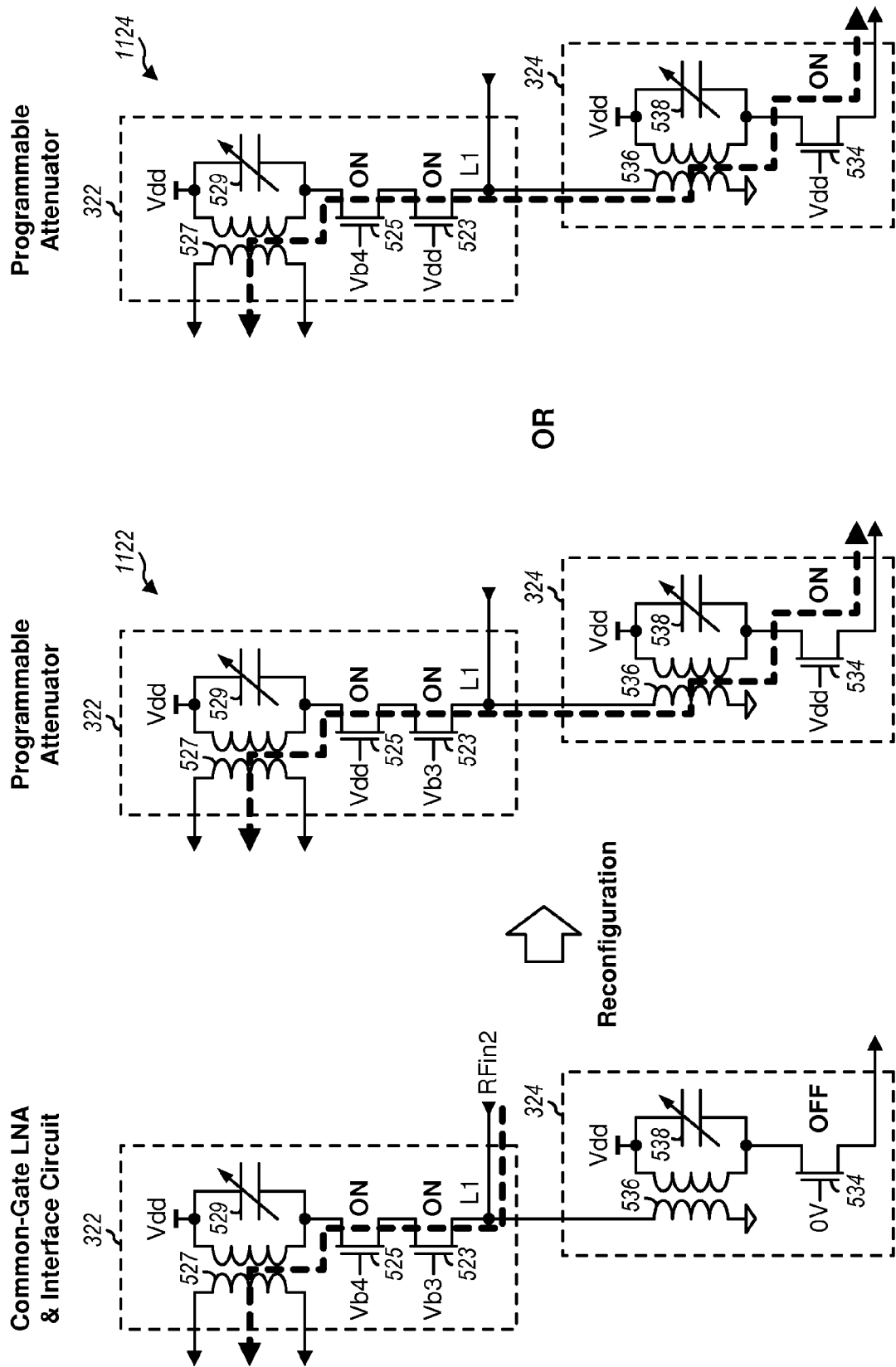
FIG. 11 shows reconfiguration of a common-gate LNA as a programmable attenuator.

FIG. 11 shows two exemplary designs of reconfiguring LNA 322 in FIG. 5 as a bi-directional programmable attenuator. As shown on the left side of FIG. 11, LNA 322 may be configured as an LNA by applying the RFin2 signal to the source of main transistor 523, applying the Vb3 bias voltage to the gate of main transistor 523, and applying the Vb4 bias voltage to the gate of cascode transistor 525. The RFin2 signal may be amplified by main transistor 523 and buffered by cascode transistor 525 to obtain an amplified RF signal, which may be provided to transformer 527.

The middle of FIG. 11 shows one exemplary design of reconfiguring LNA 322 as a programmable attenuator 1122. In this exemplary design, the gate of main transistor 523 is applied the Vb3 bias voltage, and the gate of cascode transistor 525 is applied the Vdd supply. From DC perspective, the source of main transistor 523 is coupled to circuit ground via the secondary coil of transformer 536, and the drain of cascode transistor 525 is coupled to the Vdd supply via the secondary coil of transformer 527. Hence, the bias voltages applied to the gates of transistors 523 and 525 should be higher than 0V in order to turn ON transistors 523 and 525. In this case, transistors 523 and 525 operate as switches having ON resistance that is dependent on the Vb3 bias voltage of transistor 523. In an exemplary design, the Vb3 bias voltage may be adjustable/programmable in order to obtain variable attenuation through transistors 523 and 525.

The right side of FIG. 11 shows another exemplary design of reconfiguring LNA 322 as a programmable attenuator 1124. In this exemplary design, the gate of main transistor 523 is applied the Vdd voltage, and the gate of cascode transistor 525 is applied the Vb4 bias voltage. Transistors 523 and 525 operate as switches having ON resistance that is dependent on the Vb4 bias voltage of transistor 525. In an exemplary design, the Vb4 bias voltage may be adjustable/programmable in order to obtain variable attenuation through transistors 523 and 525.

In another exemplary design, the gate of main transistor 523 is applied the Vb3 bias voltage, and the gate of cascode transistor 525 is applied the Vb4 bias voltage (not shown in FIG. 11). The Vb3 and/or Vb4 bias voltage may be adjustable/programmable in order to obtain variable attenuation through transistors 523 and 525.

In yet another exemplary design, the gate of main transistor 523 is applied the Vdd voltage, and the gate of cascode transistor 525 is also applied the Vdd voltage (not shown in FIG. 11). Transistors 523 and 525 may provide a fixed amount of attenuation.

Figure 12:
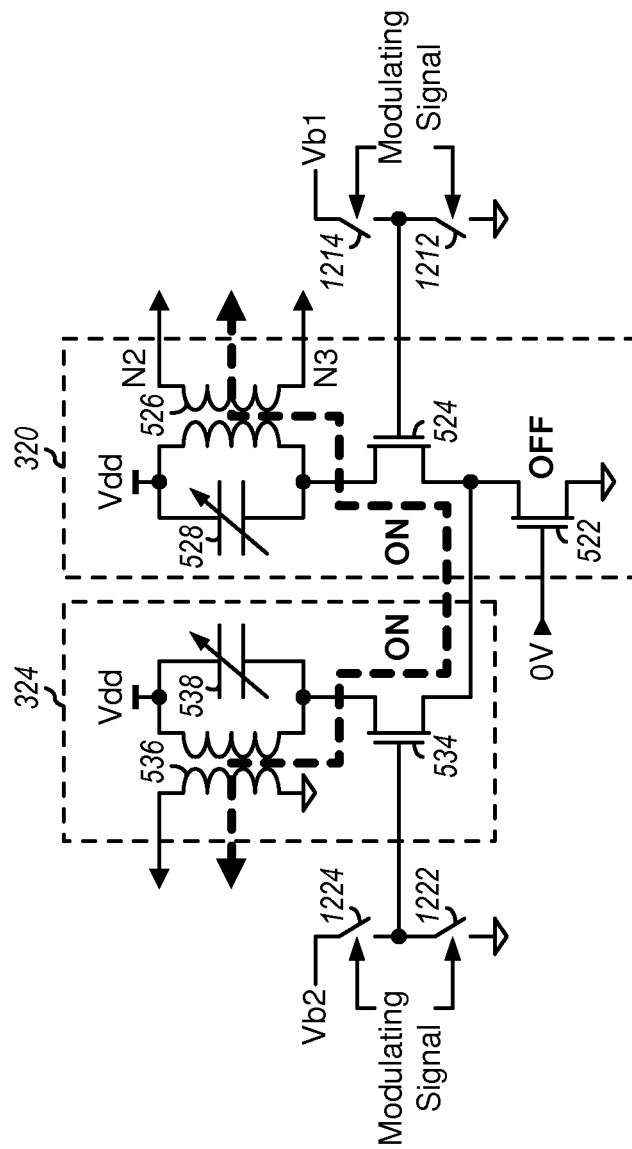
FIG. 12 shows reconfiguration of the common-source LNA and the interface circuit as a programmable attenuator and an amplitude modulation (AM) modulator.

FIG. 12 shows an exemplary design of reconfiguring LNA 320 and interface circuit 324 in FIG. 5 as a programmable attenuator and an AM modulator. This may be achieved by applying a modulating signal at the gate of cascode transistor 524 and/or at the gate of cascode transistor 534. In the exemplary design shown in FIG. 12, a switch 1212 may be coupled between the gate of cascode transistor 524 and circuit ground, and a switch 1214 may be coupled between the gate of cascode transistor 524 and the Vb1 bias voltage. The modulating signal may comprise a square wave, a rectangular wave, etc. The modulating signal may control switches 1212 and 1214, which may then amplitude modulate the test signal being passed through cascode transistors 524 and 534. Similarly, a switch 1222 may be coupled between the gate of cascode transistor 534 and circuit ground, and a switch 1224 may be coupled between the gate of cascode transistor 534 and the Vb2 bias voltage. The modulating signal may control switches 1222 and 1224, which may then amplitude modulate the test signal. Switches 1212 and 1214 may be implemented with an inverter operating between the Vb1 voltage and circuit ground and applied the modulating signal at its input. Switches 1222 and 1224 may be implemented with an inverter operating between the Vb2 voltage and circuit ground and applied the modulating signal at its input. The Vb1 and/or Vb2 bias voltage may be adjusted to obtain a desired amount of attenuation.

FIG. 12 shows an exemplary design in which a pair of switches (e.g., switches 1212 and 1214, or switches 1222 and 1224) is used to apply the modulating signal for amplitude modulation. The modulating signal may also be applied via a single switch (e.g., via only switch 1212 or only switch 1214) instead of a pair of switches.

Figure 13:
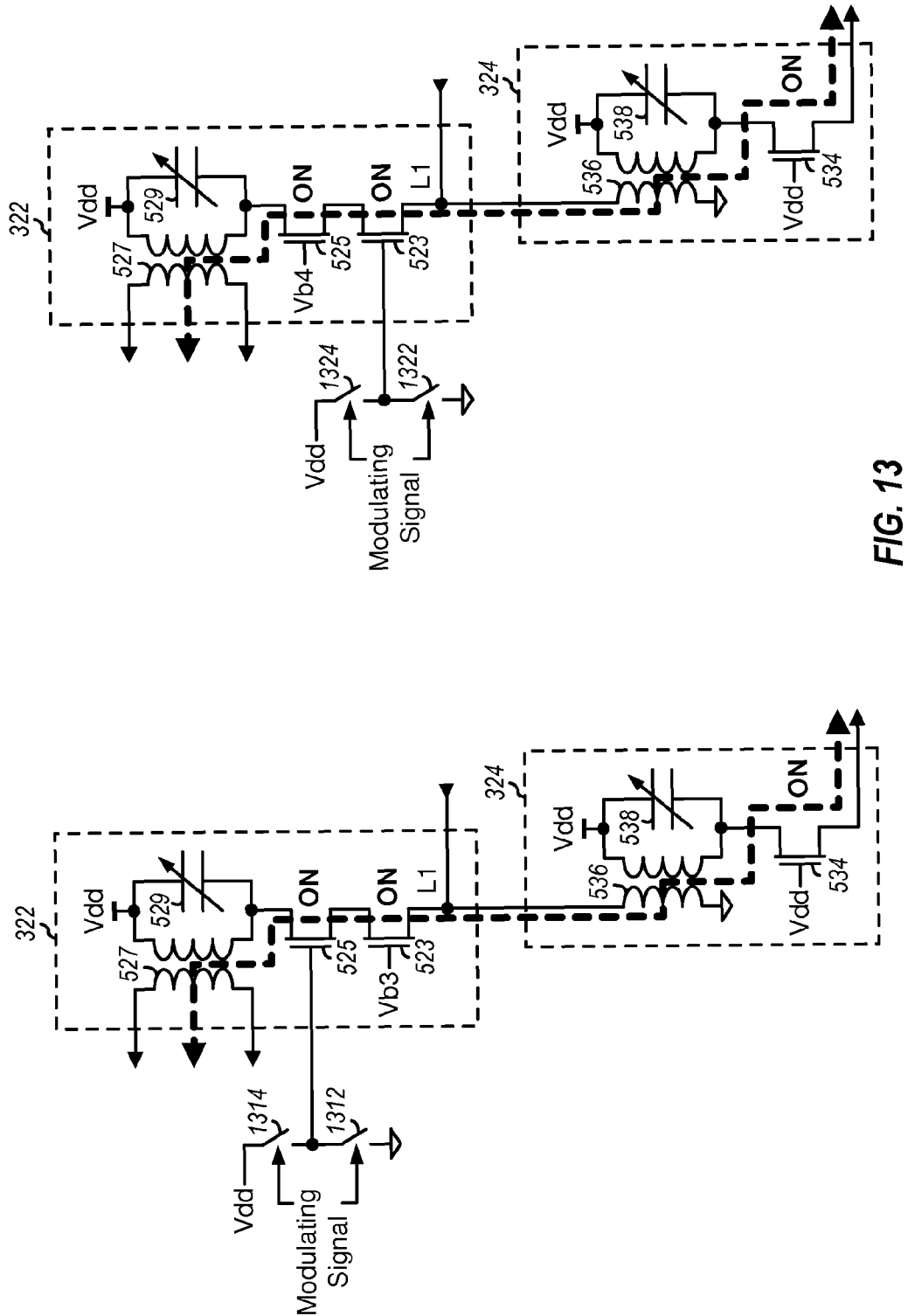
FIG. 13 shows reconfiguration of the common-gate LNA as a programmable attenuator and an AM modulator.

FIG. 13 shows two exemplary designs of reconfiguring LNA 322 in FIG. 5 as a programmable attenuator and an AM modulator. In a first exemplary design shown on the left side of FIG. 13, a Vb3 bias voltage may be applied at the gate of main transistor 523, and a modulating signal may be applied to the gate of cascode transistor 525 via two switches 1312 and 1314. Switch 1312 may be coupled between the gate of cascode transistor 525 and circuit ground. Switch 1314 may be coupled between the gate of cascode transistor 525 and the Vdd supply (as shown in FIG. 13) or the Vb4 bias voltage (not shown in FIG. 13). The modulating signal may control switches 1312 and 1314, which may then amplitude modulate the test signal being passed through transistors 523 and 525. Switches 1312 and 1314 may be implemented with an inverter operating between the Vdd supply (or the Vb4 bias voltage) and circuit ground and applied the modulating signal at its input.

In a second exemplary design shown on the right side of FIG. 13, a Vb4 bias voltage may be applied at the gate of cascode transistor 525, and a modulating signal may be applied at the gate of main transistor 523 via two switches 1322 and 1324. Switch 1322 may be coupled between the gate of main transistor 523 and circuit ground. Switch 1324 may be coupled between the gate of main transistor 523 and the Vdd supply (as shown in FIG. 13) or the Vb3 bias voltage (not shown in FIG. 13). The modulating signal may control switches 1322 and 1324, which may then amplitude modulate the test signal being passed through transistors 523 and 525. Switches 1322 and 1324 may be implemented with an inverter operating between the Vdd supply (or the Vb3 bias voltage) and circuit ground and applied the modulating signal at its input.

In general, AM modulation may be performed via one or more transistors in a signal path from an LO generator to mixers used for frequency downconversion. For example, AM modulation may be performed via cascode transistor 524 and/or 534 in receiver 310, via main transistor 523 and/or cascode transistor 525 in receiver 312, etc. AM modulation may be performed in a receiver generating a test signal and/or in a receiver receiving the test signal.

FIG. 14 shows an exemplary design of an LO generator 1400, which may be used for each of LO generators 360 and 362 in FIG. 3. LO generator 1400 includes a frequency synthesizer 1460 and a divider 1470. Frequency synthesizer 1460 generates a voltage-controlled oscillator (VCO) signal at a desired frequency. Divider 1470 divides the VCO signal in frequency and provides an LO signal comprising an ILO signal and a QLO signal.

In the exemplary design shown in FIG. 14, frequency synthesizer 1460 includes a PLL 1462, a VCO 1464, and a buffer (Buf) 1466. VCO 1464 receives a control signal from PLL 1462 and generates an oscillator signal at a frequency determined by the control signal. PLL 1462 receive a reference signal and the oscillator signal from VCO 1464, compares the phase of the oscillator signal against the phase of the reference signal, and generates the control signal for VCO 1464 such that the phase of the oscillator signal is locked to the phase of the reference signal. Buffer 1466 receives the oscillator signal from VCO 1464 and provides the VCO signal to divider 1470. Divider 1470 divides the VCO signal in frequency by a factor of N, where N may be equal to 2, 3, 4, 5, or some other value. Divider 1470 provides ILO and QLO signals.

Receiver circuits that can be reconfigured to generate test signals in a wireless device described herein may provide various advantages. First, an LO generator for a receiver (instead of an LO generator for a transmitter) may be used to generate a test signal for another receiver. The LO generator for the receiver should be able to generate the test signal for a frequency range of interest and with the desired frequency resolution and accuracy. No connection between an LO generator for a transmitter and a receiver would be required, which may preserve transmit-to-receive isolation. Second, since an LO generator for a receiver is reused to generate a test signal for another receiver, a separate dedicated wideband LO generator is not needed to generate the test signal for calibration. This may avoid higher cost and more routing for the dedicated wideband LO generator. Third, a test signal may be generated by simply reconfiguring existing circuits, e.g., LNAs and mixers. This may result in small or no additional hardware overhead. Fourth, reconfiguration of existing circuits takes place at either bias nodes or baseband nodes. Hence, performance of the receivers in the RX mode may be minimally impacted. There may be other advantages provided by the circuits and techniques described herein.

In an exemplary design, an apparatus (e.g., a wireless device, an IC, a circuit module, etc.) may include a mixer and an amplifier. The mixer (e.g., mixer 340*a* in FIGS. 5 to 9) may be formed by a first plurality of transistors (e.g., transistors 542*a* and 548*a* in FIG. 9) and a second plurality of transistors (e.g., transistors 544*a* and 546*a* in FIG. 9). The mixer may downconvert an input RF signal based on an LO signal in a first mode (e.g., an RX mode). The amplifier (e.g., amplifier 940 in FIG. 9) may be formed by the first plurality of transistors and a third plurality of transistors (e.g., transistors 540*a* and 541*a* in FIG. 9). The amplifier may amplify the LO signal and provide an amplified LO signal in a second mode (e.g., a test/calibration mode). The mixer may be for a first receiver and may provide the amplified LO signal as a second input RF signal to a second mixer in a second receiver in the second mode, e.g., as shown in FIGS. 8A and 8B.

The first plurality of transistors may include first and second transistors, the second plurality of transistors may include third and fourth transistors, and the third plurality of transistors may include fifth and sixth transistors. The LO signal may be a differential LO signal and may comprise a non-inverting LO (LOp) signal and an inverting LO (LOn) signal. The first and third transistors (e.g., transistors 542*a* and 544*a* in FIG. 9) may have their sources coupled together and their gates receiving the LOp and LOn signals in the first mode. The second and fourth transistors (e.g., transistors 546*a* and 548*a* in FIG. 9) may have their sources coupled together and their gates receiving the LOn and LOp signals in the first mode. The fifth transistor (e.g., transistor 540*a* in FIG. 9) may be coupled between the first transistor and a supply voltage. The sixth transistor (e.g., transistor 541*a* in FIG. 9) may be coupled between the fourth transistor and circuit ground.

The first and second transistors may be enabled in the first and second modes, e.g., by applying appropriate bias voltages at their gates. The third and fourth transistors may be enabled in the first mode and disabled (e.g., by applying a low voltage at their gates) in the second mode. The fifth and sixth transistors may be disabled in the first mode and enabled in the second mode. In an exemplary design, one of the first and second transistors (e.g., the first transistor) may receive a fixed bias voltage, and the other one of the first and second transistors (e.g., the second transistor) may receive a variable bias voltage, e.g., as shown in FIG. 9. This may enable adjustment of DC bias of the amplifier.

The apparatus may further include a transformer (e.g., transformer 526 in FIGS. 5 and 9) comprising a primary coil and a secondary coil. The secondary coil may have a first terminal coupled to the sources of the first and third transistors and a second terminal coupled to the sources of the second and fourth transistors. The secondary coil may provide the input RF signal to the mixer in the first mode and may provide the amplified LO signal from the amplifier in the second mode.

FIG. 15 shows an exemplary design of a process 1500 for performing downconversion and test signal generation. An input RF signal may be downconverted with a mixer, formed by a first plurality of transistors and a second plurality of transistors, based on an LO signal to obtain a downconverted signal in a first mode (block 1512). The LO signal may be amplified with an amplifier, formed by the first plurality of transistors and a third plurality of transistors, to obtain an amplified LO signal in the second mode (block 1514). At least one variable bias voltage may be applied to at least one transistor of the amplifier to adjust DC bias of the amplifier.

In another exemplary design, an apparatus (e.g., a wireless device, an IC, a circuit module, etc.) may include an amplifier and an attenuator. The amplifier (e.g., LNA 320 in FIGS. 5 and 10 or LNA 322 in FIGS. 5 and 11) may be formed by a first plurality of transistors (e.g., transistors 522 and 524 in FIG. 10 or transistors 523 and 525 in FIG. 11) and may receive and amplify an input RF signal in a first mode (e.g., an RX mode). The attenuator (e.g., attenuator 1020 in FIG. 10, attenuator 1122 in FIG. 11, or attenuator 1124 in FIG. 11) may be formed by a second plurality of transistors and may receive and pass an LO signal in a second mode (e.g., a test/calibration mode). The second plurality of transistors may include at least one of the first plurality of transistors and at least one additional transistor (e.g., transistor 534 in FIGS. 10 and 11).

In an exemplary design, the first plurality of transistors of the amplifier may include a gain transistor and a cascode transistor, which may be coupled as a common-source amplifier. The gain transistor (e.g., gain transistor 522 in FIGS. 10 and 12) may amplify the input RF signal in the first mode. The cascode transistor (e.g., cascode transistor 524 in FIGS. 10 and 12) may be coupled to the gain transistor and may pass the input RF signal in the first mode and pass the LO signal in the second mode.

The attenuator may include an interface circuit (e.g., interface circuit 324 in FIGS. 10 and 11). The at least one additional transistor of the attenuator may include a second cascode transistor (e.g., cascode transistor 534 in FIGS. 10 and 11) coupled to the gain transistor and configurable to pass the LO signal in the second mode. The second cascode transistor may be part of the interface circuit. In an exemplary design, the cascode transistor in the amplifier and/or the second cascode transistor in the interface circuit may be applied at least one variable bias voltage in the second mode to provide a variable amount of attenuation of the LO signal, e.g., as shown in FIG. 10. In an exemplary design, the cascode transistor and/or the second cascode transistor may be applied a modulating signal to amplitude modulate the LO signal in the second mode, e.g., as shown in FIG. 12. For example, only the cascode transistor may receive the modulating signal, or only the second cascode transistor may receive the modulating signal.

In another exemplary design, the first plurality of transistors of the amplifier may include a main transistor and a cascode transistor, which may be coupled as a common-gate amplifier. The main transistor (e.g., main transistor 523 in FIGS. 11 and 13) may receive the input RF signal in the first mode and may pass the LO signal in the second mode. The cascode transistor (e.g., cascode transistor 525 in FIGS. 11 and 13) may be coupled to the main transistor and may pass the input RF signal in the first mode and pass the LO signal in the second mode. The main transistor may receive a first bias voltage and the cascode transistor may receive a second bias voltage in the first mode, e.g., as shown in FIG. 11. In one design, one of the main transistor and the cascode transistor may receive a supply voltage and the other one of the main transistor and the cascode transistor may receive a bias voltage in the second mode. For example, the main transistor may receive a bias voltage and the cascode transistor may receive the supply voltage in the second mode, e.g., as shown in the middle of FIG. 11. Alternatively, the main transistor may receive the supply voltage and the cascode transistor may receive a bias voltage in the second mode, e.g., as shown in the right side of FIG. 11. In an exemplary design, the main transistor and/or the cascode transistor may receive a modulating signal to amplitude modulate the LO signal in the second mode, e.g., as shown in FIG. 13.

In an exemplary design, a tank circuit may be coupled to the cascode transistor of the amplifier. The tank circuit may comprise a coil (e.g., an inductor or a transformer/balun) and a variable capacitor. The transformer (e.g., e.g., transformer 526 or 527 in FIG. 5) may comprise a primary coil coupled in parallel with the variable capacitor. The variable capacitor (e.g., variable capacitor 528 or 529 in FIG. 5) may be coupled between a supply voltage and the cascode transistor. The variable capacitor may be adjusted to vary the frequency of the tank circuit and/or to adjust an amount of attenuation provided by the amplifier when it is reconfigured as an attenuator.

FIG. 16 shows an exemplary design of a process 1600 for performing signal amplification and test signal generation. An input RF signal may be amplified with an amplifier, formed by a first plurality of transistors, in a first mode (block 1612). An LO signal may be attenuated with an attenuator, formed by a second plurality of transistors, in the second mode (block 1614). The second plurality of transistors may include at least one of the first plurality of transistors and at least one additional transistor. In an exemplary design, at least one variable bias voltage may be applied to at least one of the second plurality of transistors of the attenuator in the second mode to obtain a variable amount of attenuation of the LO signal. In another exemplary design, a modulating signal may be applied to at least one of the second plurality of transistors of the attenuator to amplitude modulate the LO signal in the second mode.

Receiver circuits (e.g., LNAs, mixers, filters, LO generators, etc.) that can be reconfigured to generate test signals may be implemented on an IC, an analog IC, an RFIC, a mixed-signal IC, an ASIC, a printed circuit board (PCB), an electronic device, etc. The circuits may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an amplifier formed by a first plurality of transistors and configurable to receive and amplify an input radio frequency (RF) signal in a first mode; and
   an attenuator formed by a second plurality of transistors and configurable to receive and pass a local oscillator (LO) signal in a second mode, the second plurality of transistors comprising at least one of the first plurality of transistors and at least one additional transistor.

2. The apparatus of claim 1, the first plurality of transistors of the amplifier comprising:
   a gain transistor configurable to amplify the input RF signal and provide an amplified RF signal in the first mode; and a cascode transistor coupled to the gain transistor and configurable to pass the amplified RF signal in the first mode and to pass the LO signal in the second mode.

3. The apparatus of claim 2, further comprising:
an interface circuit coupled to the amplifier and configurable to receive the LO signal in the second mode.

4. The apparatus of claim 2, the at least one additional transistor of the attenuator comprising:
a second cascode transistor coupled to the gain transistor and configurable to pass the LO signal in the second mode.

5. The apparatus of claim 4, the cascode transistor, or the second cascode transistor, or both cascode transistors being applied at least one variable bias voltage in the second mode to provide a variable amount of attenuation of the LO signal.

6. The apparatus of claim 4, further comprising:
a coil coupled to the cascode transistor or the second cascode transistor; and
a variable capacitor coupled in parallel with the coil and being varied in the second mode to provide a variable amount of attenuation of the LO signal.

7. The apparatus of claim 4, the cascode transistor, or the second cascode transistor, or both cascode transistors being applied a modulating signal to amplitude modulate the LO signal in the second mode.

8. The apparatus of claim 1, the first plurality of transistors of the amplifier comprising:
a main transistor configurable to receive the input RF signal in the first mode and to pass the LO signal in the second mode; and
a cascode transistor coupled to the main transistor and configurable to pass the input RF signal in the first mode and to pass the LO signal in the second mode.

9. The apparatus of claim 8, one of the main transistor and the cascode transistor being configurable to receive a supply voltage and other one of the main transistor and the cascode transistor being configurable to receive a bias voltage in the second mode.

10. The apparatus of claim 8, the main transistor, or the cascode transistor, or both transistors being configurable to receive a modulating signal to amplitude modulate the LO signal in the second mode.

11. A method comprising:
amplifying an input radio frequency (RF) signal with an amplifier, formed by a first plurality of transistors, in a first mode; and
attenuating a local oscillator (LO) signal with an attenuator, formed by a second plurality of transistors, in the second mode, the second plurality of transistors comprising at least one of the first plurality of transistors and at least one additional transistor.

12. The method of claim 11, further comprising:
applying at least one variable bias voltage to at least one of the second plurality of transistors of the attenuator in the second mode to obtain a variable amount of attenuation of the LO signal.

13. The method of claim 11, further comprising:
applying a modulating signal to at least one of the second plurality of transistors of the attenuator to amplitude modulate the LO signal in the second mode.

14. An apparatus comprising:
means for amplifying an input radio frequency (RF) signal in a first mode; and
means for attenuating a local oscillator (LO) signal in the second mode, the means for attenuating comprising at least a portion of the means for amplifying.

15. The apparatus of claim 14, further comprising:
means for applying at least one variable bias voltage to the means for attenuating in the second mode to obtain a variable amount of attenuation of the LO signal.

16. The apparatus of claim 14, further comprising:
means for applying a modulating signal to the means for attenuating to amplitude modulate the LO signal in the second mode.

* * * * *